(12) United States Patent
Bolotnikov et al.

(10) Patent No.: US 10,056,457 B2
(45) Date of Patent: Aug. 21, 2018

(54) ELECTRIC FIELD SHIELDING IN SILICON CARBIDE METAL-OXIDE-SEMICONDUCTOR (MOS) DEVICE CELLS USING CHANNEL REGION EXTENSIONS

(71) Applicant: General Electric Company, Schenectady, NY (US)

(72) Inventors: Alexander Viktorovich Bolotnikov, Niskayuna, NY (US); Peter Almern Losee, Clifton Park, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/595,717

(22) Filed: May 15, 2017

(65) Prior Publication Data

US 2017/0338300 A1    Nov. 23, 2017

Related U.S. Application Data

(60) Provisional application No. 62/340,396, filed on May 23, 2016.

(51) Int. Cl.
*H01L 29/06* (2006.01)
*H01L 29/16* (2006.01)
(Continued)

(52) U.S. Cl.
CPC ........ *H01L 29/1608* (2013.01); *H01L 21/046* (2013.01); *H01L 21/0465* (2013.01);
(Continued)

(58) Field of Classification Search
CPC ............. H01L 29/1608; H01L 29/0623; H01L 29/7816; H01L 29/063; H01L 21/0465;
(Continued)

(56) References Cited

U.S. PATENT DOCUMENTS 8,212,321 B2    7/2012 Lamey et al.
8,421,148 B2    4/2013 Harris et al.
(Continued)

FOREIGN PATENT DOCUMENTS

| CN | 202816955 U | 3/2013 |
| DE | 102004009602 B4 | 9/2009 |
| DE | 11 2014 003 637 T5 | 4/2016 |

OTHER PUBLICATIONS

International Search Report and Written Opinion issued in connection with corresponding PCT Application No. PCT/US2017/033953 dated Aug. 7, 2017.
(Continued)

*Primary Examiner* — Selim Ahmed
(74) *Attorney, Agent, or Firm* — GE Global Patent Operation; John Darling

(57) ABSTRACT

The subject matter disclosed herein relates to semiconductor power devices, such as silicon carbide (SiC) power devices. In particular, the subject matter disclosed herein relates to shielding regions in the form of channel region extensions for that reduce the electric field present between the well regions of neighboring device cells of a semiconductor device under reverse bias. The disclosed channel region extensions have the same conductivity-type as the channel region and extend outwardly from the channel region and into the JFET region of a first device cell such that a distance between the channel region extension and a region of a neighboring device cell having the same conductivity type is less than or equal to the parallel JFET width. The disclosed shielding regions enable superior performance relative to a conventional stripe device of comparable dimensions, while still providing similar reliability (e.g., long-term, high-temperature stability at reverse bias).

19 Claims, 28 Drawing Sheets

(51) Int. Cl.
  *H01L 29/78* (2006.01)
  *H01L 21/04* (2006.01)
  *H01L 29/66* (2006.01)
  *H01L 29/10* (2006.01)
  *H01L 29/745* (2006.01)
  *H01L 29/739* (2006.01)
  *H01L 29/74* (2006.01)

(52) U.S. Cl.
  CPC ........ *H01L 29/063* (2013.01); *H01L 29/0623* (2013.01); *H01L 29/0646* (2013.01); *H01L 29/0696* (2013.01); *H01L 29/1095* (2013.01); *H01L 29/66068* (2013.01); *H01L 29/7395* (2013.01); *H01L 29/7455* (2013.01); *H01L 29/78* (2013.01); *H01L 29/7802* (2013.01); *H01L 29/7816* (2013.01); *H01L 29/7393* (2013.01); *H01L 29/74* (2013.01)

(58) Field of Classification Search
  CPC ............. H01L 29/7802; H01L 29/7395; H01L 29/7455; H01L 29/1095; H01L 21/046; H01L 29/78; H01L 29/0646; H01L 29/0696; H01L 29/06
  See application file for complete search history.

(56) References Cited

U.S. PATENT DOCUMENTS

| | | | |
|---|---|---|---|
| 8,674,440 | B2 | 3/2014 | Korec |
| 2001/0001494 | A1 | 5/2001 | Kocon |
| 2004/0099885 | A1 | 5/2004 | Yeo et al. |
| 2004/0164304 | A1 | 8/2004 | Magri et al. |
| 2011/0101374 | A1 | 5/2011 | Ryu et al. |
| 2013/0200451 | A1 | 8/2013 | Yilmaz et al. |
| 2013/0313570 | A1 | 11/2013 | Sdrulla et al. |
| 2014/0367771 | A1 | 12/2014 | Chatty et al. |
| 2015/0053999 | A1* | 2/2015 | Kumagai ............ H01L 29/0615 257/77 |
| 2015/0372088 | A1 | 12/2015 | Bolotnikov et al. |
| 2015/0372089 | A1 | 12/2015 | Bolotnikov et al. |
| 2016/0155836 | A1 | 6/2016 | Iwamuro et al. |
| 2017/0338303 | A1 | 11/2017 | Bolotnikov et al. |
| 2017/0338313 | A1 | 11/2017 | Bolotnikov et al. |

OTHER PUBLICATIONS

Bolotnikov, A. V., et al., Electric field shielding in silicon carbide metal-oxide-semiconductor (MOS) device cells, GE U.S. Appl. No. 62/340,396, filed May 23, 2016.

* cited by examiner

ELECTRIC FIELD SHIELDING IN SILICON CARBIDE METAL-OXIDE-SEMICONDUCTOR (MOS) DEVICE CELLS USING CHANNEL REGION EXTENSIONS

CROSS-REFERENCE TO RELATED APPLICATIONS

This application claims priority from and the benefit of U.S. Provisional Application Ser. No. 62/340,396, entitled "ELECTRIC FIELD SHIELDING IN SILICON CARBIDE METAL-OXIDE-SEMICONDUCTOR (MOS) DEVICE CELLS," filed May 23, 2016, which is hereby incorporated by reference in its entirety for all purposes.

BACKGROUND

The subject matter disclosed herein relates to semiconductor power devices, such as silicon carbide (SiC) power devices, including field transistors (e.g., MOSFET, DMOSFET, UMOSFET, VMOSFET, trench MOSFET, etc.), insulated gate bipolar transistors (IGBT), and insulated base MOS-controlled thyristors (IBMCT).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Power conversion devices are widely used throughout modern electrical systems to convert electrical power from one form to another form for consumption by a load. Many power electronics systems utilize various semiconductor devices and components, such as thyristors, diodes, and various types of transistors (e.g., metal-oxide-semiconductor field-effect transistor (MOSFETs), insulated gate bipolar transistors (IGBTs), and other suitable transistors).

Specifically for high-frequency, high-voltage, and/or high-current applications, silicon carbide (SiC) devices, may provide a number of advantages in terms of high temperature operation, reduced conduction and switching losses, and smaller die size than corresponding silicon (Si) devices. However, SiC also presents a number of technical and design challenges relative to Si, such as lower dopant diffusion during SiC device fabrication and higher electric fields within SiC devices during operation (e.g., under reverse bias). While the SiC portions of a SiC device may be robust to these higher electric fields, other portions of the SiC device, such as silicon oxide ($SiO_2$) dielectric layers, may fail under these higher electric fields. Accordingly, it is desirable to develop SiC device designs that reduce high electric fields to improve device reliability without substantially diminishing device performance.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. It may be appreciated that the shapes, positions, and alignments of features presently disclosed are, for the sake of simplicity, illustrated and described as being relatively ideal (e.g., square, rectangular, and hexagonal cells and shielding regions with perfectly straight and aligned features). However, as may be appreciated by one of skill in the art, process variations and technical limitations may result in cellular designs with less than ideal shapes or irregular features may still be within the spirit of the present technique. As such, the term "substantially" as used herein to describe a shape, a position, or an alignment of a feature is meant to encompass ideal or target shapes, positions, and alignments as well as imperfectly implemented shapes, positions, and alignments resulting from variability in the semiconductor fabrication process, as may be appreciated by one skilled in the art. Additionally, semiconductor device cells are described herein as being disposed or fabricated "at the surface," "in the surface," "on the surface," or "along the surface" of a semiconductor layer, which is intended to include semiconductor device cells having portions disposed within the bulk of the semiconductor layer, portions disposed proximate to the surface of the semiconducting layer, portions disposed even with the surface of the semiconductor layer, and/or portions disposed above or on top of the surface of the semiconductor layer.

Figure 1A:
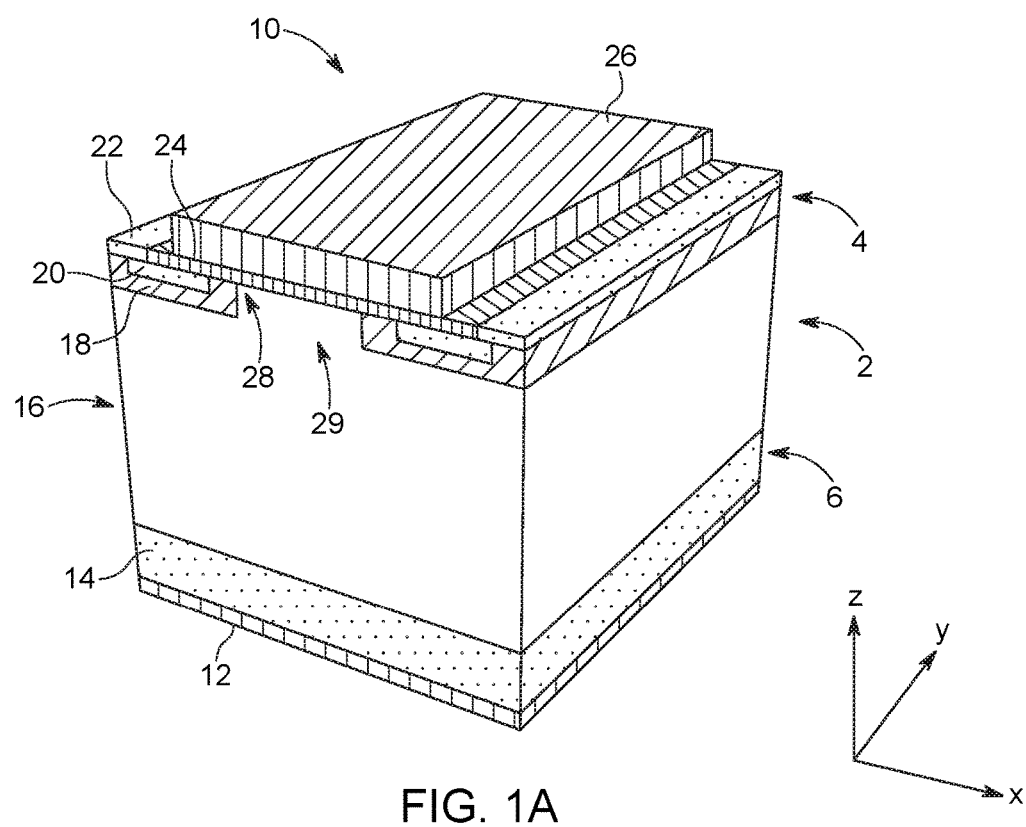
FIG. 1A is a schematic of a typical planar MOSFET device.

One of the essential building blocks of modern power electronics is the field-effect transistor (FET) device. For example, FIG. 1A illustrates an active cell of a planar n-channel field-effect transistor, namely a DMOSFET, hereinafter MOSFET device 10. It may be appreciated that, in order to more clearly illustrate certain components of the MOSFET device 10, as well as other devices discussed below, certain commonly understood design elements (e.g., top metallization, passivation, edge termination, and so forth) may be omitted.

The illustrated MOSFET device 10 of FIG. 1A includes a semiconductor device layer 2 (e.g., an epitaxial SiC layer) having a first surface 4 and a second surface 6. The semiconductor device layer 2 includes a drift region 16 having a first conductivity type (e.g., an n-type drift layer 16), a well region 18 having a second conductivity type (e.g., a p-well 18) disposed adjacent to the drift region 16 and proximal to the first surface 4. The semiconductor device layer 2 also includes a source region 20 having the first conductivity type (e.g., n-type source region 20) adjacent to the well region 18 and proximal to the first surface 4. A dielectric layer 24 (also referred to as a gate insulating layer or gate dielectric layer) is disposed on a portion of the first surface 4 of the semiconductor device layer 2, and a gate electrode 26 is disposed on the dielectric layer 24. The second surface 6 of the semiconductor device layer 2 is a substrate layer 14 (e.g., a SiC substrate layer), and the drain contact 12 is disposed on the bottom of device 10 along the substrate layer 14.

During on-state operation, an appropriate gate voltage (e.g., at or beyond a threshold voltage ($V_{TH}$) of the MOSFET device 10) may cause an inversion layer to be formed in the channel region 28, as well as a conductive path to be enhanced in the junction field-effect transistor (JFET) region 29 due to accumulation of carriers, allowing current to flow from the drain contact 12 (i.e., the drain electrode) to the source contact 22 (i.e., the source electrode). It should be appreciated that, for the MOSFET devices discussed herein, the channel region 28 may be generally defined as an upper portion of the well region 18 disposed below the gate electrode 26 and gate dielectric 24. Furthermore, while the present approach may be discussed below in the context of SiC MOSFET devices, it should be appreciated the present approach may be applicable to other types of material systems (e.g., silicon (Si), germanium (Ge), aluminum nitride (AlN), gallium nitride (GaN), gallium arsenide (GaAs), diamond (C), or any other suitable wide band-gap semiconductor) as well as other types of device structures (e.g., UMOSFET, VMOSFETs, insulated gate bipolar transistors (IGBT), insulated base MOS-controlled thyristors (IBMCT), or any other suitable FET and/or MOS device) utilizing both n- and p-channel designs.

Figure 1B:
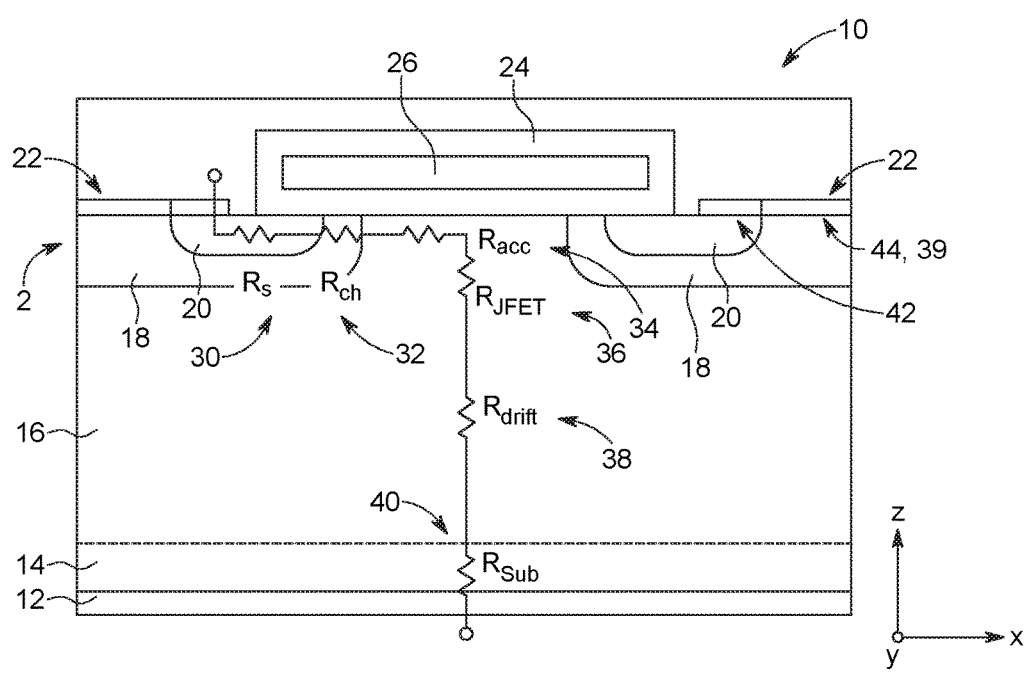
FIG. 1B is a schematic illustrating resistances for various regions of a typical MOSFET device.

FIG. 1B is a schematic cross-sectional view of the SiC device 10 of FIG. 1A. The source contacts 22 of the MOSFET device 10 illustrated in FIG. 1B generally provide an ohmic connection to the source electrode, and are disposed over both a portion of the source regions 20 and a portion of the well regions 18. The source contact 22 is generally a metallic interface comprising one or more metal layers situated between these semiconductor portions of the MOSFET device 10 and the metallic source electrode. For clarity, the portion of the source region 20 (e.g., n+ source region 20) of the MOSFET device 10 disposed below the contact 22 may be more specifically referred to herein as a source contact region 42 of the MOSFET device 10. Similarly, a portion of the well region 18 of the MOSFET device 10, which may be doped at a higher level than the remainder of the well region 18, may be more specifically referred to herein as a body region 39 (e.g., p+ body region 39) of the MOSFET device 10. For clarity, the portion of the body region 39 that is disposed below (e.g., covered by, directly electrically connected to) the contact 22, may be more specifically referred to herein as a body contact region 44 (e.g., p+ body contact region 44) of the MOSFET device 10.

As illustrated in FIG. 1B, the various regions of the MOSFET device 10 may each have an associated resistance, and a total resistance (e.g., an on-state resistance, $R_{ds}(on)$) of the MOSFET device 10, which may be represented as a sum of each of these resistances. For example, as illustrated in FIG. 1B, on-state resistance, $R_{ds}(on)$, of the MOSFET device 10 may be approximated as a sum of: a resistance $R_s$ 30 (e.g., a resistance of source region 20 and a resistance of the contact 22); a resistance $R_{ch}$ 32 (e.g., an inversion channel resistance of the region 28 illustrated in FIG. 1A); a resistance $R_{acc}$ 34 (e.g., a resistance of an accumulation layer between the gate oxide 24 and portion of drift layer 16 located between well regions 18); a resistance $R_{JFET}$ 36 (e.g., resistance of undepleted neck region between well regions 18); a resistance $R_{drift}$ 38 (e.g., the resistance about the drift layer 16); and a resistance $R_{sub}$ 40 (e.g., the resistance about the substrate layer 14). Note that the resistances illustrated in FIG. 1B are not intended to be exhaustive, and that other resistances (e.g., drain contact resistance, spreading resistance, etc.) could potentially be present within the semiconductor device 10.

In certain cases, one or two resistance components illustrated in FIG. 1B may dominate conduction losses of the semiconductor device 10, and addressing these factors can significantly impact $R_{ds}$(on). For example, for devices in which the drift resistance 38, the substrate resistance 40 and the contact resistance 30 are less significant (compared to other resistance components), such as low-voltage devices or devices suffering from low inversion layer mobility (e.g. SiC devices), the channel resistance ($R_{ch}$ 32) may account for a significant portion of device conduction losses. By further example, in medium- and high-voltage devices, JFET region resistance ($R_{JFET}$ 36) may account for a significant portion of total conduction losses.

Figure 2:
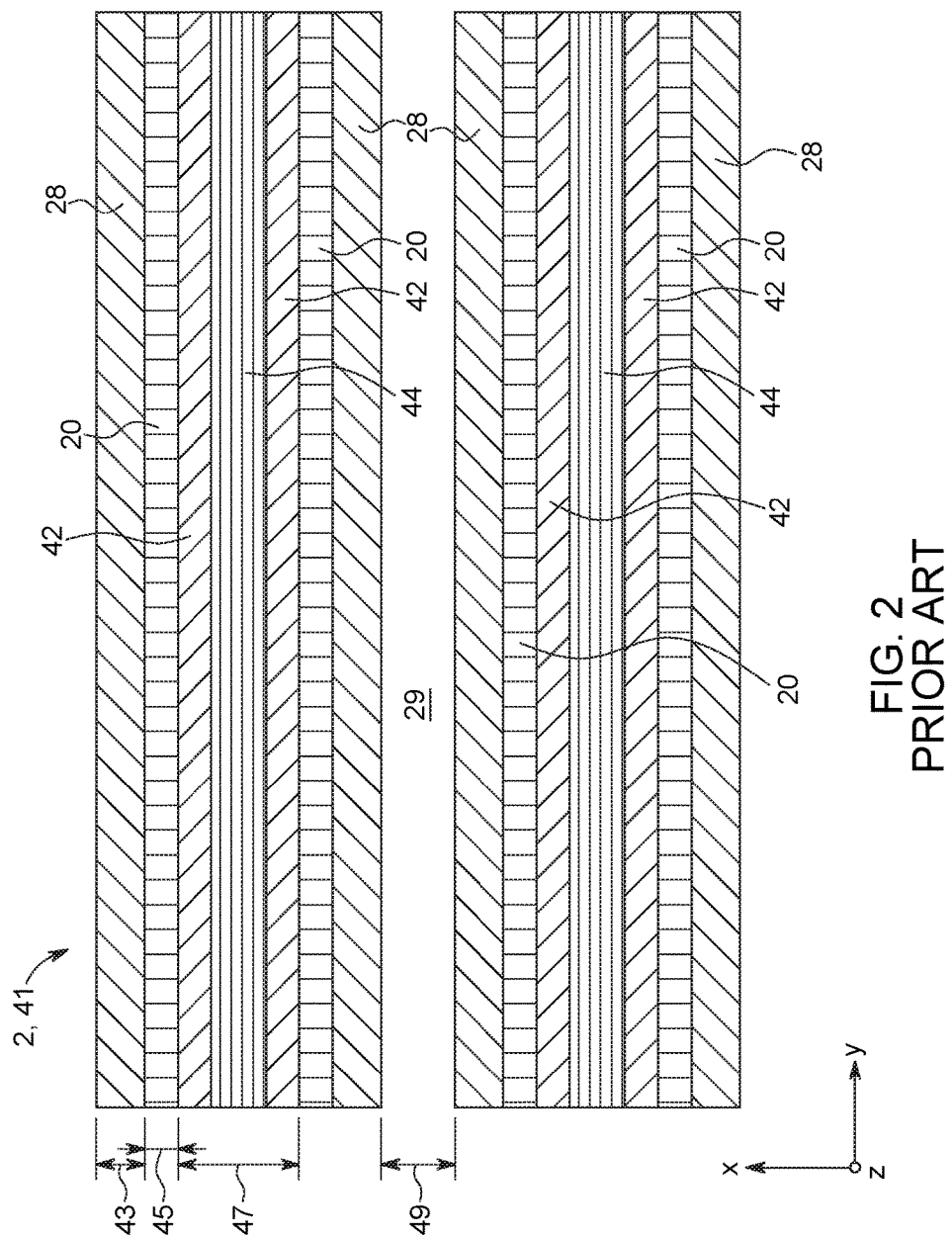
FIG. 2 is a top-down view of a surface of a SiC layer that includes a typical MOSFET device structure having a stripe cell layout.

FIG. 2 illustrates a top-down view of a semiconductor device layer 2 including a MOSFET device structure 41 having a conventional stripe cell layout. In terms of dimensions, the conventional MOSFET device structure 41 may be described as having a particular channel length ($L_{ch}$ 43), length from channel region to ohmic region ($L_{ch\_to\_ohm}$ 45), width of the ohmic region ($W_{ohm}$ 47), and width of the JFET region ($W_{JFET}$ 49). While the conventional stripe cell layout illustrated in FIG. 2 offers good reliability (e.g., long term and high temperature performance), the relatively high channel resistance ($R_{ch}$ 32) and JFET resistance ($R_{JFET}$ 36) of the MOSFET device structure 41 results in a relatively high $R_{ds}$(on), which diminishes the electrical performance of the device.

Figure 3:
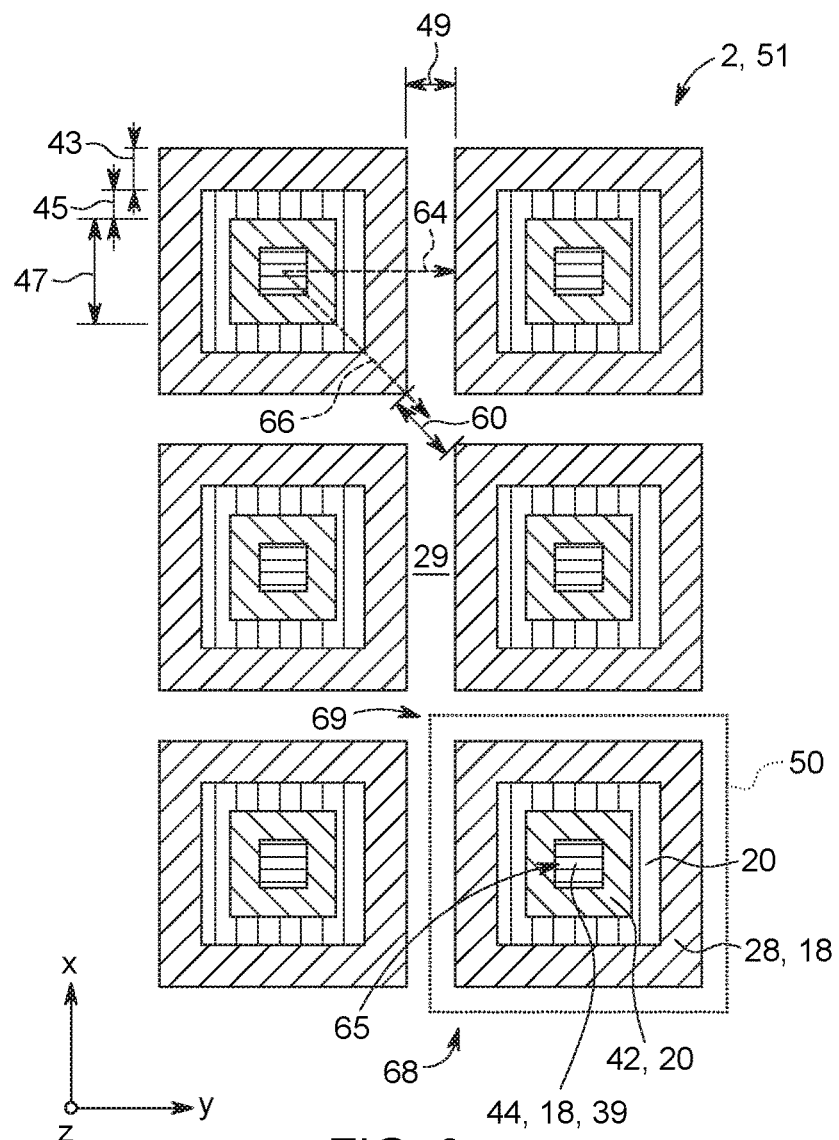
FIG. 3 is a top-down view of a SiC layer that includes a number of square semiconductor device cells.
Figure 4:
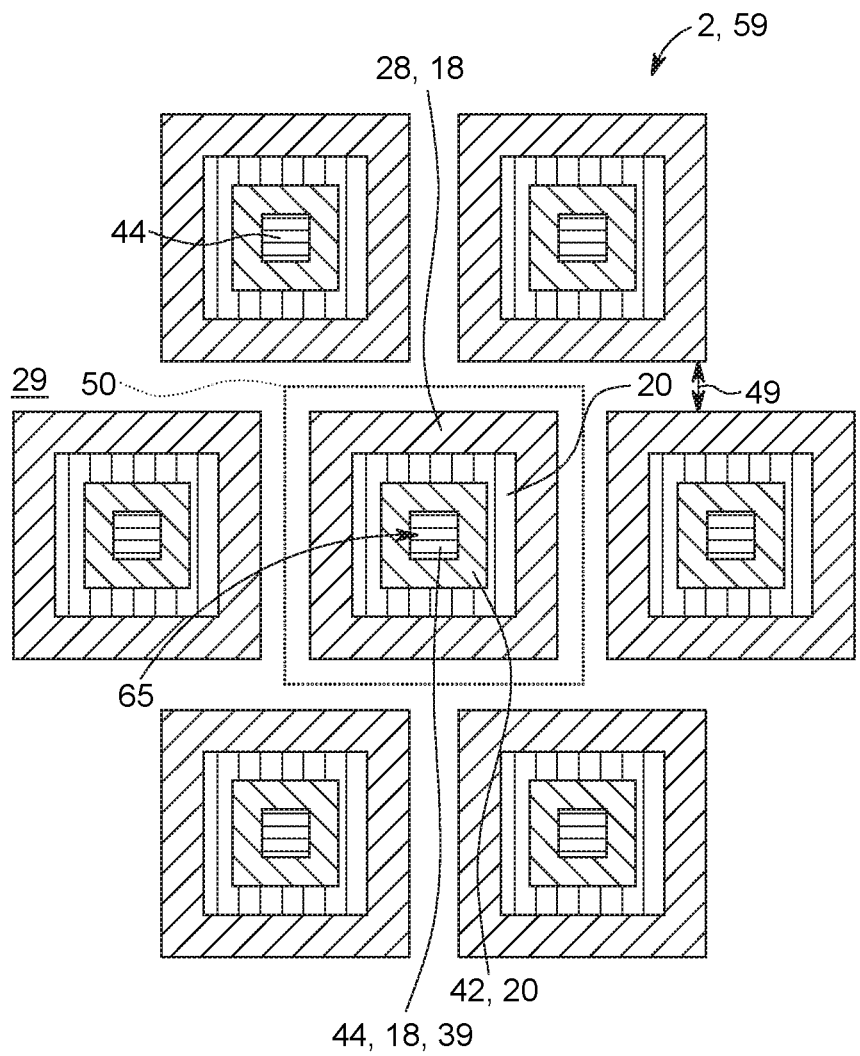
FIG. 4 is a top-down view of a SiC layer that includes a number of staggered square semiconductor device cells.
Figure 5:
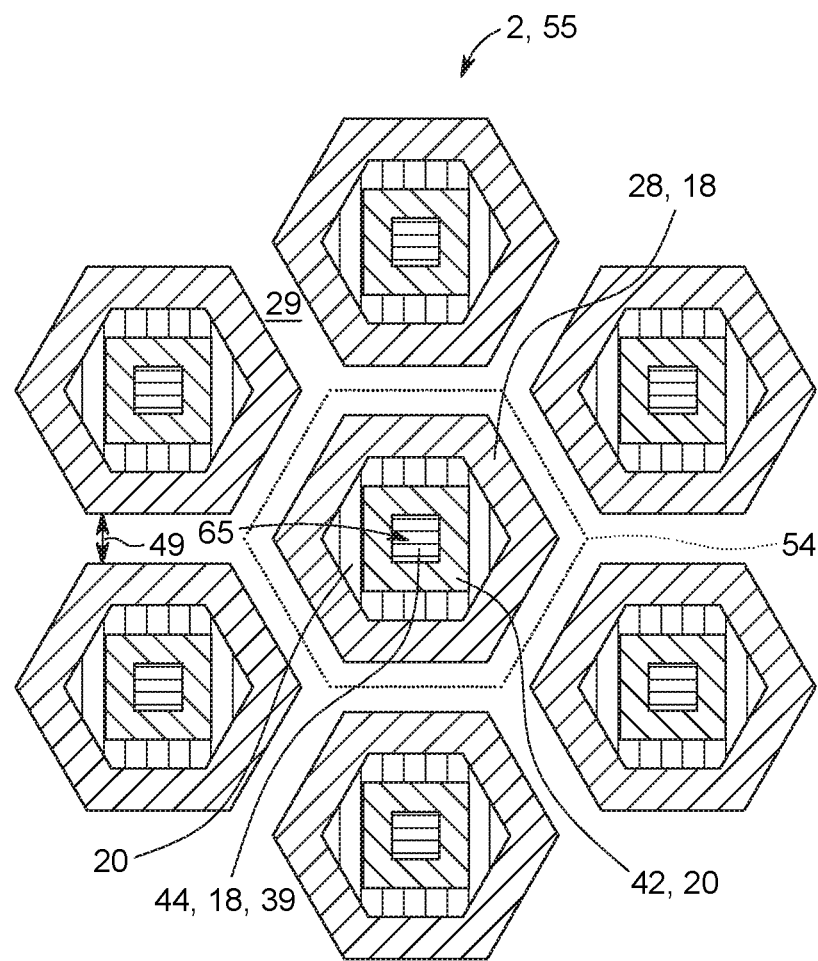
FIG. 5 is a top-down view of a SiC layer that includes a number of hexagonal semiconductor device cells.

One way in which channel resistance ($R_{ch}$ 32) and JFET resistance ($R_{JFET}$ 36) can be reduced for semiconductor devices is through the use of cellular device designs. FIGS. 3-5 illustrate top-down views of a semiconductor device layer 2 having different conventional cellular designs and layouts. These conventional designs may be described as being unshielded relative to the shielded device cells of the present technique discussed below. It may be appreciated that for FIGS. 3-5, as well as for the top-down views of device cells presented below, certain features of the device cells (e.g., gate contact 26, dielectric layer 24, contacts 22) are omitted to provide an unobstructed view of the surface of the semiconductor device layer 2. In particular, FIG. 3 illustrates square device cells 50 in an aligned layout 51, while FIG. 4 illustrates the square cellular device cells 50 in a staggered or offset layout 52. FIG. 5 illustrates hexagonal device cells 54 in an aligned layout 55. In general, the illustrated cell designs and layouts illustrated in FIGS. 3-5 enable reduced $R_{ds}$(on) by reducing both channel resistance ($R_{ch}$ 32) and the JFET resistance ($R_{JFET}$ 36) relative to a stripe cell layout, as illustrated in FIG. 2. For example, the square device cells 50 of FIG. 3 provide an approximately 20% lower $R_{ds}$(on) than the stripe device 41 of FIG. 2, assuming similar process/technology limited dimensions (e.g., same $L_{ch}$ 43, $L_{ch\_to\_ohm}$ 45, $W_{ohm}$ 47, and $W_{JFET}$ 49). It may be appreciated that the layouts illustrated herein using a few device cells that represent a subset of the numerous device cells of a semiconductor device on the semiconductor surface 2.

In FIGS. 3-5, the illustrated conventional square device cell 50 and hexagonal device cell 54 each include a body contact region 44 disposed in the center 65 of each cell that, as illustrated in FIG. 1B, is part of the well region 18. The body contact region 44 is surrounded by a source region 20. More specifically, the body contact region 44 of each cell may be surrounded by the source contact region 42 of the source region 20, wherein the doping of the source contact region 42 may be the same as the remainder of the source region 20. The source region 20 of each cell is surrounded by a channel region 28, which also is part of the well region 18, as illustrated in FIGS. 1A and 1B. The channel region 28 is, in turn, surrounded by the JFET region 29. In general, the width of a particular part of the JFET region 29 is defined as the shortest distance between regions having the opposite doping type (e.g., p-type) compared that of JFET region 29 (e.g., n-type). While each device cell includes a JFET region 29 about the perimeter of the cell, these JFET regions 29 may, at times, be collectively referred to as the JFET region 29 of the semiconductor device layer 2 for simplicity. It may also be appreciated that the semiconductor device layer 2, the source region 20, including the source contact region 42, and the JFET region 29 have a first conductivity type (e.g., n-type), while well region 18, including the body contact region 44 and the channel region 28 have a second conductivity type (e.g., p-type). As used herein, two device cells may be referred to as neighboring cells or adjacent cells when any portion of the boundaries of the two cells touch (e.g., along a side 68 or at a corner 69 of the boundary the device cells). As such, it may be appreciated that, each square device cell 50 of FIG. 3 has eight neighboring or adjacent cells, while each staggered square cell 50 of FIG. 4 and each hexagonal device cell 54 of FIG. 5 has six neighboring or adjacent cells.

While the cellular designs illustrated in FIGS. 3-5 may enable lower $R_{ds}$(on) relative to a stripe cell layout, as illustrated in FIG. 2, it is presently recognized that such cellular designs can have a substantially higher electric field in portions of the JFET region 29 between the corners of the well regions of neighboring device cells under blocking conditions. For SiC MOS devices, the electric field in the dielectric layer 24 (e.g., SiO$_2$) disposed over the JFET region 29 (illustrated in FIGS. 1 and 2) may be around ten times higher compared to that in Si devices when the device cells operate under reverse bias. While SiC is generally robust toward higher electric fields, the dielectric layer 24 may experience breakdown during long term operation, resulting in reliability issues with the SiC device cells 50 and 54.

Figure 6:
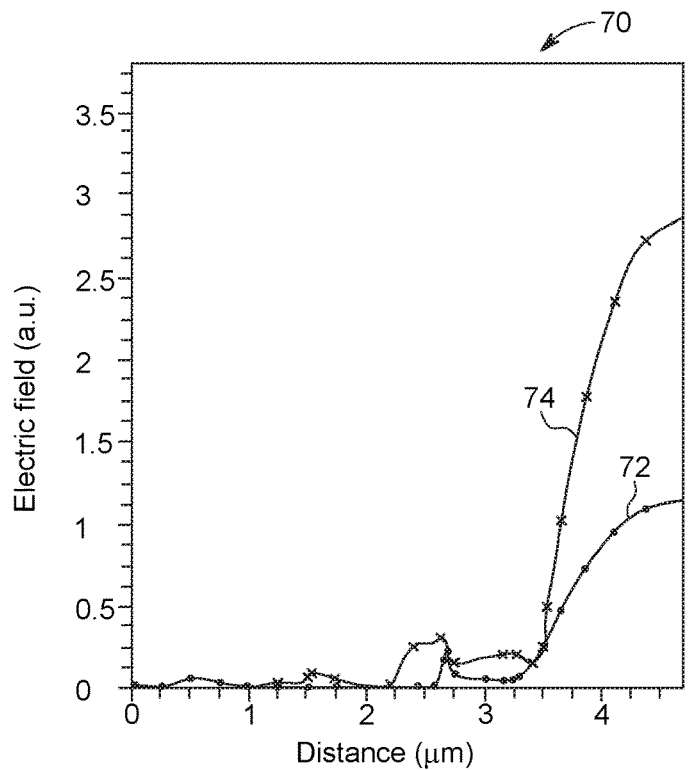
FIG. 6 is a graph depicting normalized electric field strength in a portion of a SiC layer and in a portion of a dielectric layer disposed over the SiC layer, wherein the portion of the SiC layer is disposed between parallel portions of unshielded square device cells under reverse bias.

In particular, in a SiC MOSFET under reverse bias, the electric field present in the widest portion of the JFET region 29 between the corners of the well regions of neighboring device cells 50 and 54 illustrated in FIGS. 3-5 is substantially higher than in other portions of the JFET region 29. As illustrated in FIG. 3, the diagonal distance 60 between the corners of the channel regions 28 of the device cells 50 is greater than the distance 49 between parallel portions (i.e., $W_{JFET,parallel}$ 49) of the channel regions 28 of neighboring device cells 50. FIG. 6 is a graph 70 that plots the strength of the electric field (in arbitrary units (au)) under reverse bias for portions of an unshielded device cell 50 disposed along the arrow 64 illustrated in FIG. 3. More specifically, FIG. 6 includes a first curve 72 illustrating the electric field in the JFET region 29 in FIG. 1A, and includes a second curve 74 illustrating the electric field in the dielectric layer 24 (as illustrated in FIGS. 1A and 1B), for the example unshielded device cell 50 (i.e., 1200 V SiC MOSFET square device cells, having $8\times10^{15}$ cm$^{-3}$ epi doped and 11 µm thick drift layer, wherein $W_{JFET,parallel}$ 49 is 2.6 µm) at $V_{ds}$=1200 V. As illustrated in the graph 70 of FIG. 6, at the center 65 of the device cell 50 (i.e., at x=0 µm) the electric field in both the semiconductor device layer 2 and the dielectric layer 24 is low, and the electric field increases to a maximum field strength in the middle of the JFET region 29 (i.e., at approximately x=4.7 µm).

Figure 7A:
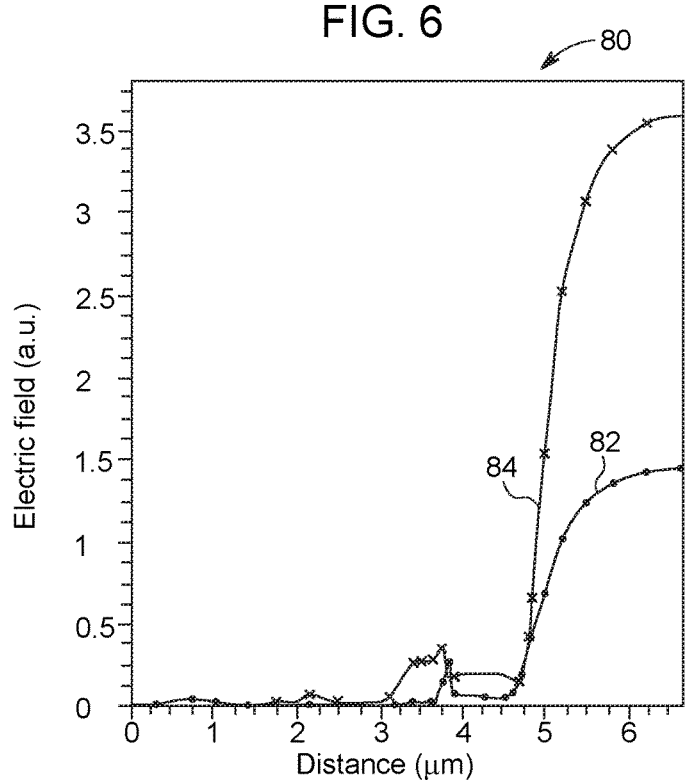
FIG. 7A is a graph depicting normalized electric field strength in a portion of a SiC layer and in a portion of a dielectric layer disposed over the SiC layer, wherein the portion of the SiC layer is disposed between the corners of the well regions of unshielded square device cells under reverse bias.

FIG. 7A is a graph 80 that plots the strength of the electric field (in arbitrary units (au)) for portions of an unshielded SiC device cell 50 under reverse bias, wherein the portions are disposed along the diagonal arrow 66 illustrated in FIG. 3. Like FIG. 6, the graph 80 of FIG. 7A includes a first curve 82 illustrating the electric field in the semiconductor device layer 2, and includes a second curve 84 illustrating the electric field in the dielectric layer 24 disposed over the semiconductor device layer 2 (as illustrated in FIGS. 1A and 1B), for an example conventional SiC device cell 50 having the same dimensions and conditions as indicated for FIG. 6. As illustrated in FIG. 7A, at the center of the conventional SiC device cell 50 (i.e., at x=0 μm) the electric field is low, and, moving diagonally through the corner of the conventional device cell 50, the electric field increases to a peak field strength in the middle of the JFET region 29 (i.e., at approximately x=6.65 μm). Comparing FIGS. 6 and 7, for the example unshielded SiC square cells 50, the peak or maximum electric field between cell corners (i.e., distance 60, along the arrow 66 of FIG. 3) is approximately 20% higher than the peak or maximum electric field between parallel portions of the cells 50 (i.e., distance 49, along the arrow 64 of FIG. 3). As a result, as shown in FIG. 7A, the peak electric field in the dielectric layer 24 is greater between the corners of the well regions 18 of neighboring device cells 50 (e.g., between the corners of the channel regions 28 of neighboring device cells, at the corner 69 where neighboring cells meet), which may result in long term reliability issues for such unshielded device cells 50.

With the foregoing in mind, present embodiments are directed toward cellular device designs that incorporate one or more shielding regions, in the form of implanted extensions of the channel region 28 that reduce the electric field in the JFET regions 29 (as well as in the gate dielectric layer 24 illustrated in FIG. 1B) in locations where the corners 69 of neighboring device cells meet without significantly increasing $R_{ds}(on)$. Accordingly, the shielding regions of the presently disclosed devices are designed so that the distance between the implant extensions and well regions of neighboring device cells less than or equal to the distance between parallel portions of the well regions of the neighboring device cells. Therefore, the present designs ensure no portion of the JFET region 29 is wider than the width of the JFET region 29 between parallel portions of the channel regions of neighboring device cells (i.e., $W_{JFET,parallel}$ 49). Further, present designs maintain a channel region width and/or a JFET region density that is greater than or equal to that of a conventional stripe device (e.g., stripe cell device 41 of FIG. 2) having comparable dimensions (e.g., same $L_{ch}$, $L_{ch\_to\_ohm}$, $W_{ohm}$). As such, the presently disclosed shielded device cells provide superior performance relative to a conventional stripe device cells of comparable dimensions, while still providing similar reliability (e.g., long-term, high-temperature stability). Furthermore, the shielding regions of the presently disclosed cellular designs may be implanted simultaneously with other features of the device cells, and as such, do not increase the complexity or cost of fabrication.

With the foregoing in mind, present embodiments are directed towards a device cell design that includes shielding regions that are channel region extensions. An "extension" as used herein, refers to an implanted region generally that extends a feature (e.g., channel region 28) of the device cell beyond its typical boundaries. In particular, certain disclosed device designs and layouts typically include at least one channel region extension per device cell. As used herein, a "channel region extension" is an extension of the channel region 28 of the device cell (which is part of the well region 18, as illustrated in FIGS. 1A and 1B) that projects outwardly into a portion of the JFET region 29 where multiple device cells meet. As discussed below, since the distance between the channel region extension of a first device cell and the well region of a neighboring device cell defines the width of this portion the JFET region, the disclosed channel region extensions ensure that no portion of the JFET region 29 is wider than $W_{JFET,parallel}$ 49, suppressing aforementioned electric fields, improving device reliability and reducing local drain-induced barrier lowering (DIBL).

It may also be appreciated that the disclosed channel region extensions may be formed using the same implantation step used to form the well region 18, and as such, the channel region extensions may be substantially the same as the well region 18 in terms of doping concentration and depth. Additionally, the disclosed channel region extensions may have a particular width, or a maximum width, that is generally smaller than the width of the other features defined during the well implant processing (e.g., the width of the well region 18). In certain embodiments, the disclosed channel region extensions may have a width that is defined or limited by the lower practically achievable limit for defining features using present implantation techniques. As discussed below, in certain embodiments, the width of the channel region extension of a device cell may be greater than twice the channel length (i.e., >2$L_{ch}$) of the device cell, and the device cell may also include a source region extension that extends in the same direction as the channel extension. As used herein, a "source region extension" is an extension of the source region 20 of the device cell that extends in the same direction as the channel extension.

Figure 8:
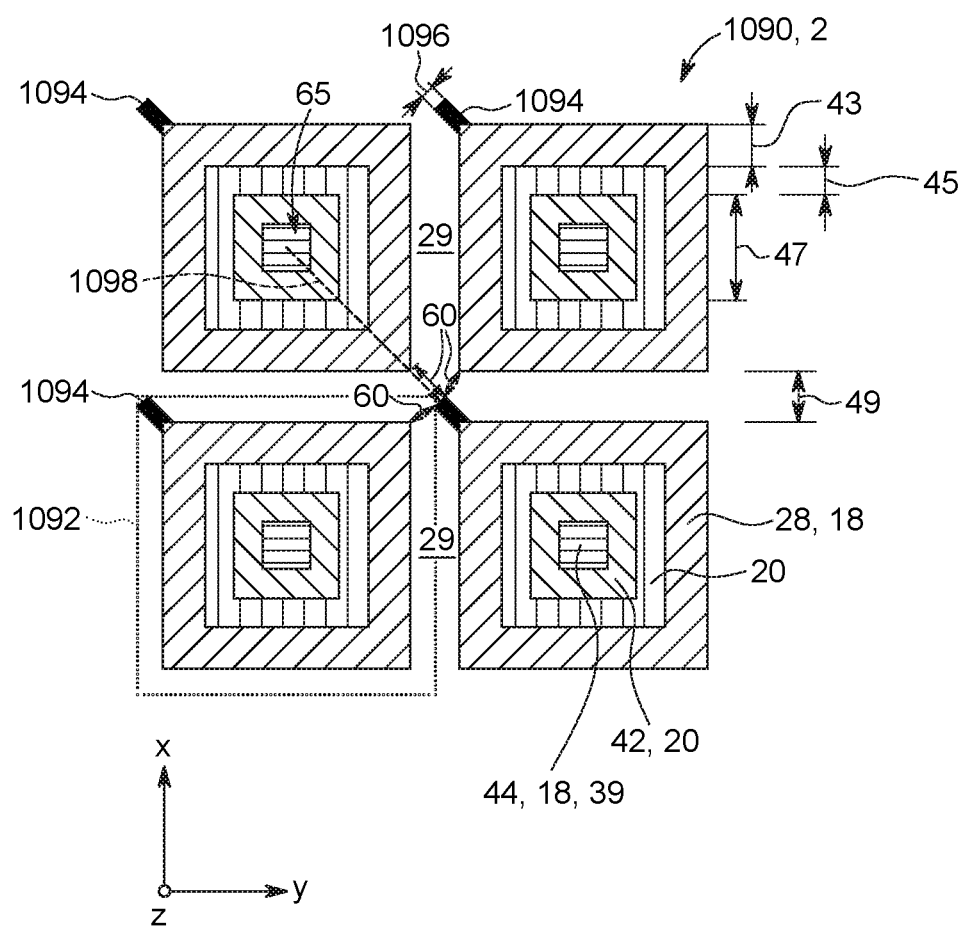
FIGS. 8-10 are a top-down views of SiC layers having device layouts that include a number of square SiC device cells with different examples of channel region extensions, in accordance with embodiments of the present technique.
Figure 9:
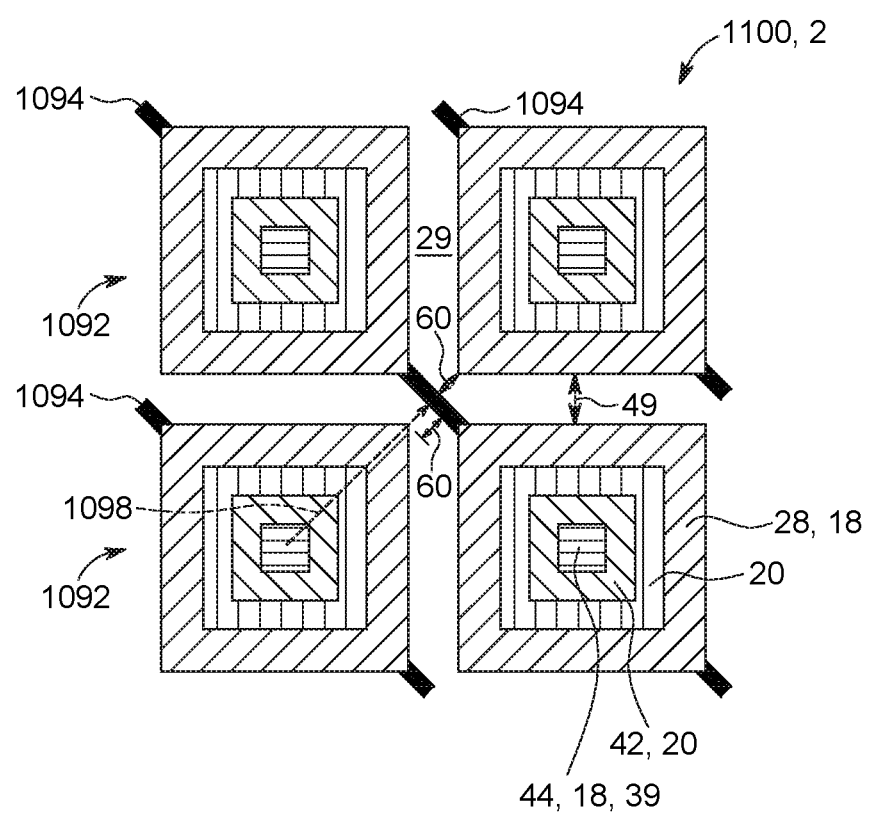
Figure 10:
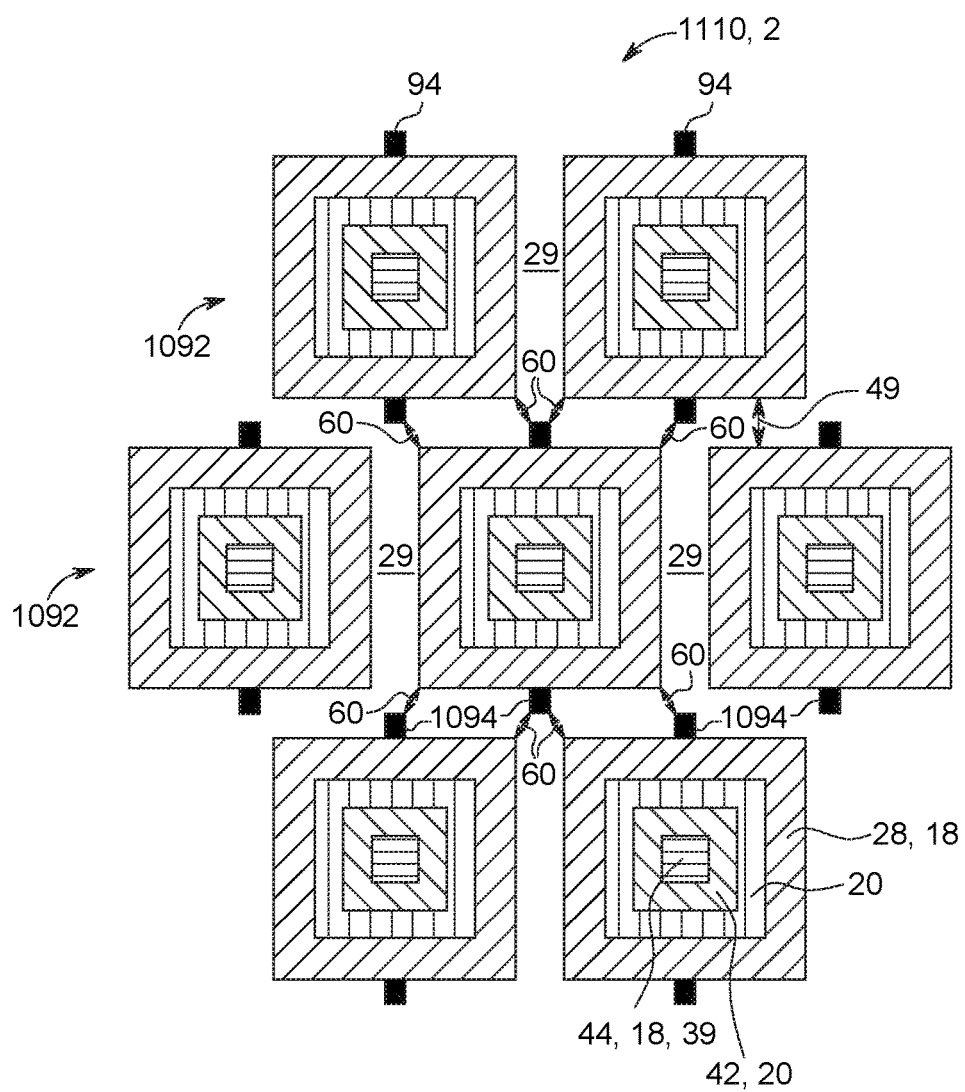
Figure 23:
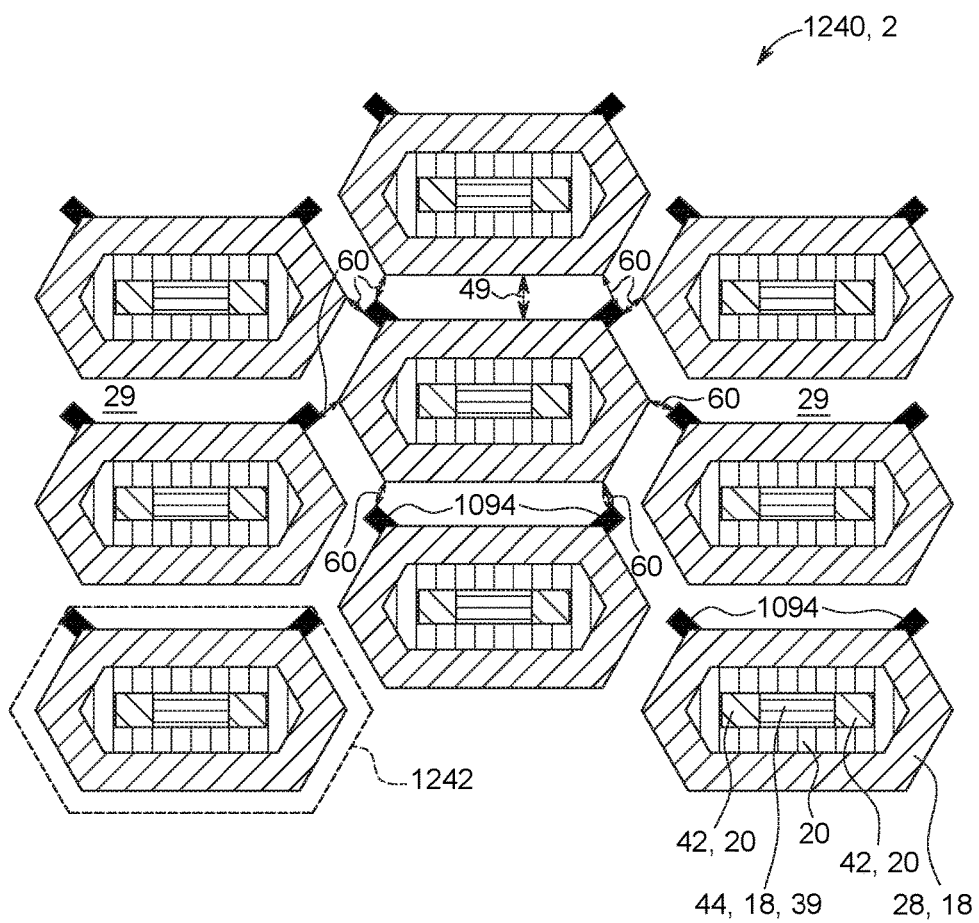
FIGS. 23 and 24 are top-down views of SiC layers having device layouts that include a number of elongated hexagonal SiC device cells with different examples of channel region extensions, in accordance with embodiments of the present technique.
Figure 24:
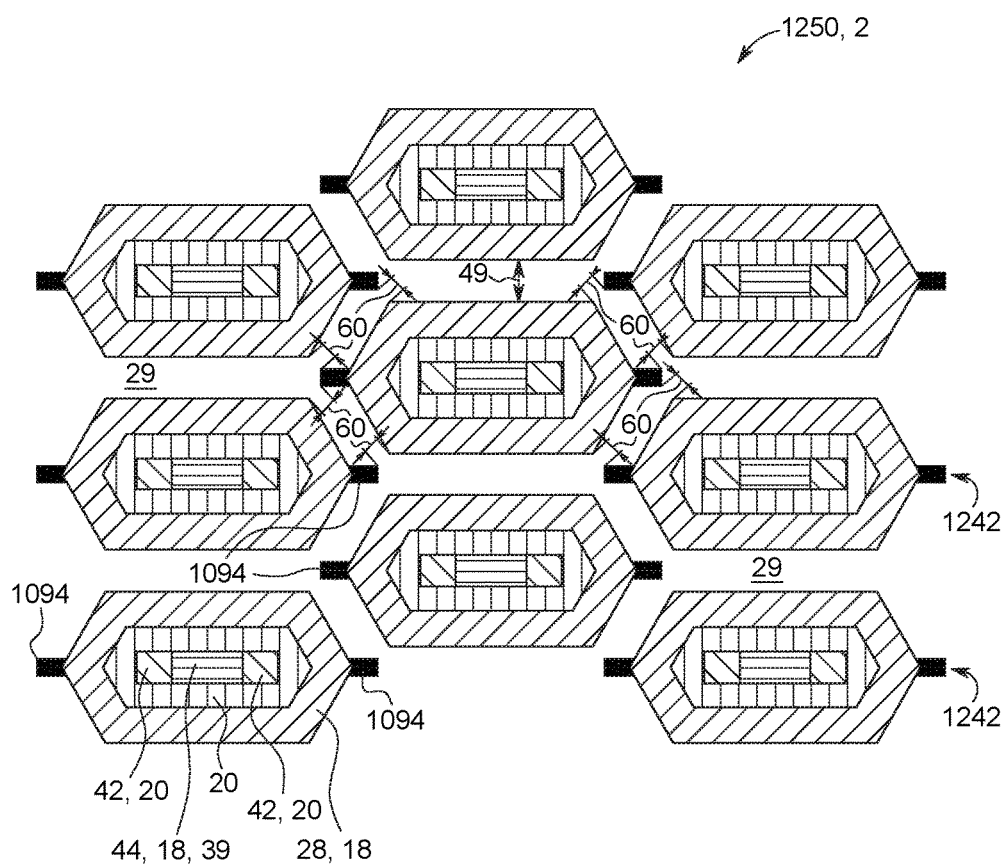

FIGS. 8-27 illustrate top-down views of embodiments of a semiconductor layer 2 with various layouts that include at least one channel extension, disposed in what would otherwise be the widest portion of JFET region (i.e., between the well regions of neighboring device cells), to reduce the electric field in this portion of JFET region. More specifically, FIGS. 8-10 illustrate example layouts of square device cells, FIGS. 11-16 illustrate example layouts of elongated rectangular device cells, FIGS. 17-22 illustrate example layouts of hexagonal device cells, FIGS. 23 and 24 illustrate example layouts of elongated hexagonal device cells, and FIGS. 24-27 illustrate example layouts of square device cells that also include source region extensions, wherein each layout includes a plurality of channel region extensions. The elongated rectangular device cells of FIGS. 11-16 and the elongated hexagonal device cells of FIGS. 23 and 24 may include one or more features described in co-pending U.S. patent application Ser. Nos. 14/313,785 and 14/313,820, both filed Jun. 24, 2014, which are incorporated by reference herein in their entireties for all purposes. It may be appreciated that while a number of different example embodiments of devices and layouts are presented below, these are merely intended to be examples. As such, in other embodiments, channel region extensions of the present approach may have other shapes (e.g., square, rounded, curved, varying width, elongated or distorted shapes) without negating the effect of the present approach. It also may be appreciated that the channel and/or JFET density of the disclosed cellular layout embodiments illustrated in FIGS. 8-27 is generally greater than that of a stripe device cell layout 41, as illustrated in FIG. 2, having the same design parameters.

With the foregoing in mind, FIG. 8 illustrates a device layout 1090 that includes a number of square device cells 1092, in accordance with embodiments of the present technique. The illustrated square device cells 1092 each include a single channel region extension 1094 that extends the channel region 28 into the JFET region 29. As such, the channel region extensions 1094 generally ensure that all of the distances 60 between the well regions 18 and the channel region extensions 1094 of neighboring device cells 1092 (e.g., between regions of neighboring device cells 1092 that have the second type of conductivity) are less than or equal to the distance 49 between parallel portions of the well regions 18 of the neighboring cells 1092. In other words, the channel region extensions 1094 generally ensure that no portion of the JFET region 29 is wider than $W_{JFET,parallel}$ 49. In certain embodiments, the width 1096 of the channel region extensions 1094 may be less than approximately 1 μm (e.g., between approximately 0.1 μm and approximately 1 μm) or less than approximately 0.5 μm (e.g., between approximately 0.1 μm and approximately 0.5 μm). Additionally, the channel region extensions 1094 illustrated in FIG. 8 are oriented substantially in the same direction, meaning that they extend from an equivalent corner of each cell 1092, and extension directions are substantially parallel to one another. It may be appreciated that, in certain embodiments, the channel region extensions 1094 may not be aligned with the diagonal of the device cell or be oriented in a parallel direction relative to one another, as illustrated in FIG. 8. It may further be noted that the disclosed channel region extensions, like the embodiment illustrated in FIG. 8, provide a reduction of electric field when moving along the arrow 1098, as set forth below with respect to FIG. 7B. It may be appreciated that for a number of the illustrated embodiments, the channel region extensions 1094 do not extend from all corners or all sides of the channel region 28.

Figure 7B:
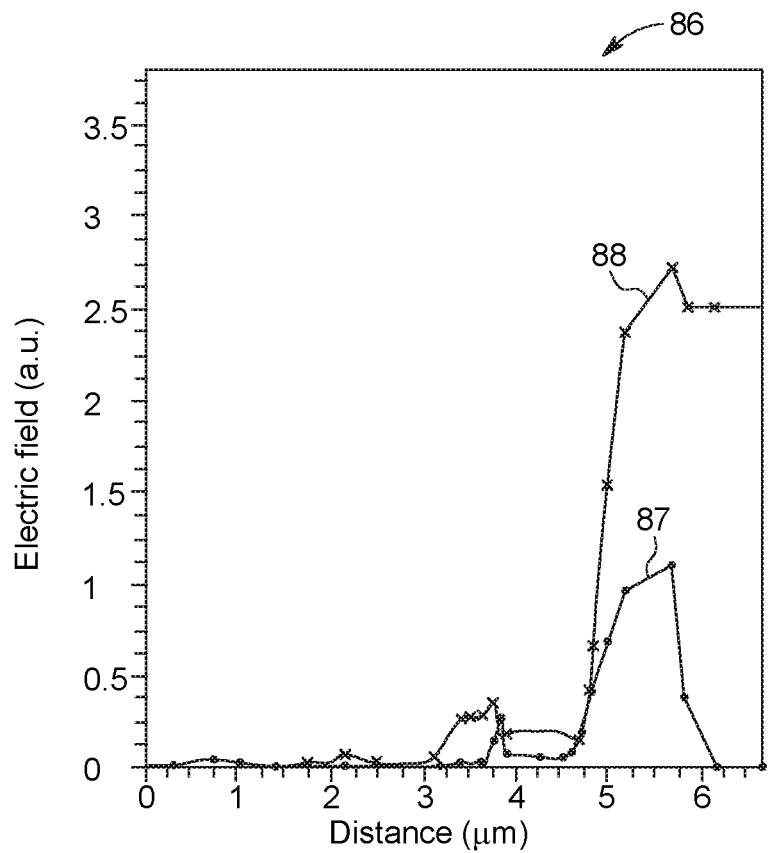
FIG. 7B is a graph depicting normalized electric field strength in a portion of a SiC layer and in a portion of a dielectric layer disposed over the SiC layer, wherein the portion of the SiC layer is disposed between the corners of the well regions of square device cells that are shielded by a channel region extension and operating reverse bias, in accordance with embodiments of the present technique.

To illustrate the improvement provided by the disclosed channel region extensions 1094, FIG. 7B is a graph 86 that plots the magnitude of the electric field (in the same arbitrary units (a.u.) as FIGS. 6 and 7A) for portions of an embodiment of a SiC device cell 1092 of FIG. 8 under reverse bias, wherein the particular portions of the device cell 1092 are disposed along the diagonal arrow 1098 illustrated in FIG. 8. Like FIGS. 6 and 7A, the graph 86 of FIG. 7B includes a first curve 87 illustrating the electric field in the SiC layer 2, and includes a second curve 88 illustrating the electric field in the dielectric layer 24 disposed over the SiC layer 2 (as illustrated in FIGS. 1A and 1B), for an example SiC device cell 1092 having the same dimensions as the unshielded device cells represented in FIGS. 6 and 7A. As illustrated in FIG. 7B, at the center 65 of the SiC device cell 1092 (i.e., at x=0 μm) the electric field in both the SiC layer 2 and the dielectric layer 24 is low, and, moving diagonally through the corner of the device cell 1092, the electric field increases to a peak field strength (i.e., at approximately x=5.5 μm) before reaching the channel region extension 1094 (i.e., at approximately x=5.75 μm), and thereafter the magnitude of the electric field sharply declines. A corresponding decline is also observed in the dielectric layer 24, as illustrated by the curve 88. Comparing FIGS. 7A and 7B, the peak or maximum electric field between the corners of the well regions of the shielded SiC device cells 1092 (i.e., along the arrow 1098) of FIG. 8 is approximately 20% lower than the peak or maximum electric field between the corners (i.e., along the arrow 66) for the unshielded SiC square cells 50 of FIG. 3. As a result, as shown in FIG. 7B, the peak electric field in the dielectric layer 24 is lower in the portion of the JFET region 29 that is between the corners of the well regions neighboring device cells 1092, which may result in improved long term reliability for these SiC device cells 1092.

In certain embodiments, the channel region extensions 1094 of the device cells 1092 can extend all the way through the JFET region 29 and overlap with the channel region extensions 1094 of neighboring device cells 1092. It may be appreciated that, while such designs provide effective shielding, they may also result in slightly higher $R_{ds}$(on), relative to designs in which the channel region extensions 1094 do not connect, due to a slightly lower JFET density. For example, FIG. 9 illustrates a device layout 1100 that includes a number of square device cells 1092, in accordance with embodiments of the present technique. The square device cells 1092 of FIG. 9 each include channel region extensions 1094 that extend from two opposite corners of the channel region 28 and into the JFET region 29 to overlap with the channel region extensions 1094 of two neighboring device cells 1092. Additionally, the channel region extensions 1094 illustrated in FIG. 9 are oriented substantially in the same direction, meaning that they extend from equivalent corners of each cell 1092, and are oriented in substantially parallel direction relative to one another. Accordingly, the channel region extensions 1094 generally ensure that all of the distances 60 between the well regions 18 and the channel region extensions 1094 of neighboring device cells 1092 (e.g., between regions of neighboring device cells 1092 that have the second type of conductivity) are less than or equal to the distance 49 between parallel portions of the well regions 18 of the neighboring cells 1092. In other words, the channel region extensions 1094 generally ensure that no portion of the JFET region 29 is wider than $W_{JFET,parallel}$ 49.

The disclosed channel region extensions may also be used, for example, with other layouts of square cellular devices. FIG. 10 illustrates a device layout 1110 that includes a number of staggered, square device cells 1092, in accordance with embodiments of the present technique. Each of the square device cells 1092 of the cells 1092 of FIG. 10 includes channel region extensions 1094 that extend from two opposite sides of the channel region 28 and into the JFET region 29. The channel region extensions 1094 generally ensure that all of the distances 60 between the well regions 18 and the channel region extensions 1094 of neighboring device cells 1092 (e.g., between regions of neighboring device cells 1092 that have the second type of conductivity) are less than or equal to the distance 49 between parallel portions of the well regions 18 of the neighboring cells 1092. In other words, the channel region extensions 1094 generally ensure that no portion of the JFET region 29 is wider than $W_{JFET,parallel}$ 49.

Figure 11:
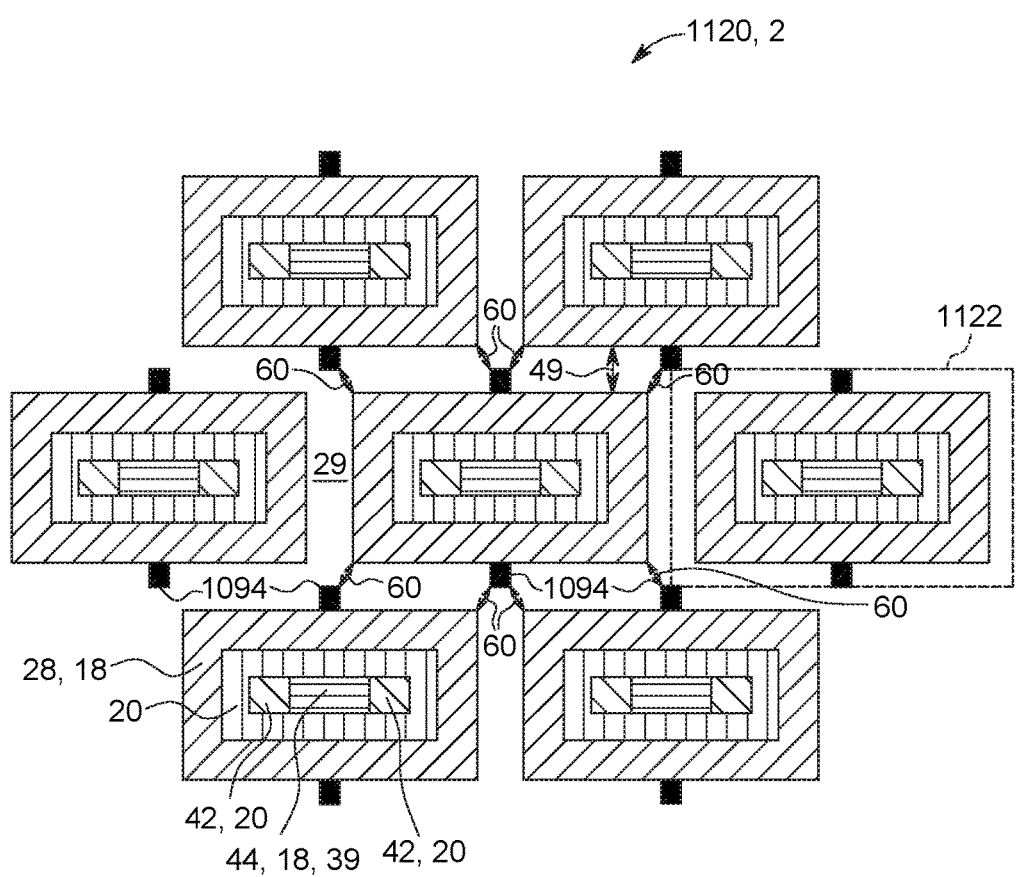
FIGS. 11-16 are top-down views of SiC layers having device layouts that include a number of elongated rectangular SiC device cells with different examples of channel region extensions, in accordance with embodiments of the present technique.

As mentioned, the presently disclosed channel region extensions may also be used with cellular devices having other cell shapes. For example, FIG. 11 illustrates a device layout 1120 that includes a number of elongated rectangular device cells 1122, in accordance with embodiments of the present technique. Each of the rectangular device cells 1122 of FIG. 11 includes channel region extensions 1094 that extend from two opposite sides of the channel region 28 and into the JFET region 29. As such, the channel region extensions 1094 generally ensure that all of the distances 60 between the well regions 18 and the channel region extensions 1094 of neighboring device cells 1122 (e.g., between regions of neighboring device cells 1122 that have the second type of conductivity) are less than or equal to the distance 49 between parallel portions of the well regions 18 of the neighboring cells 1122. In other words, the channel region extensions 1094 generally ensure that no portion of the JFET region 29 is wider than $W_{JFET,parallel}$ 49.

Figure 12:
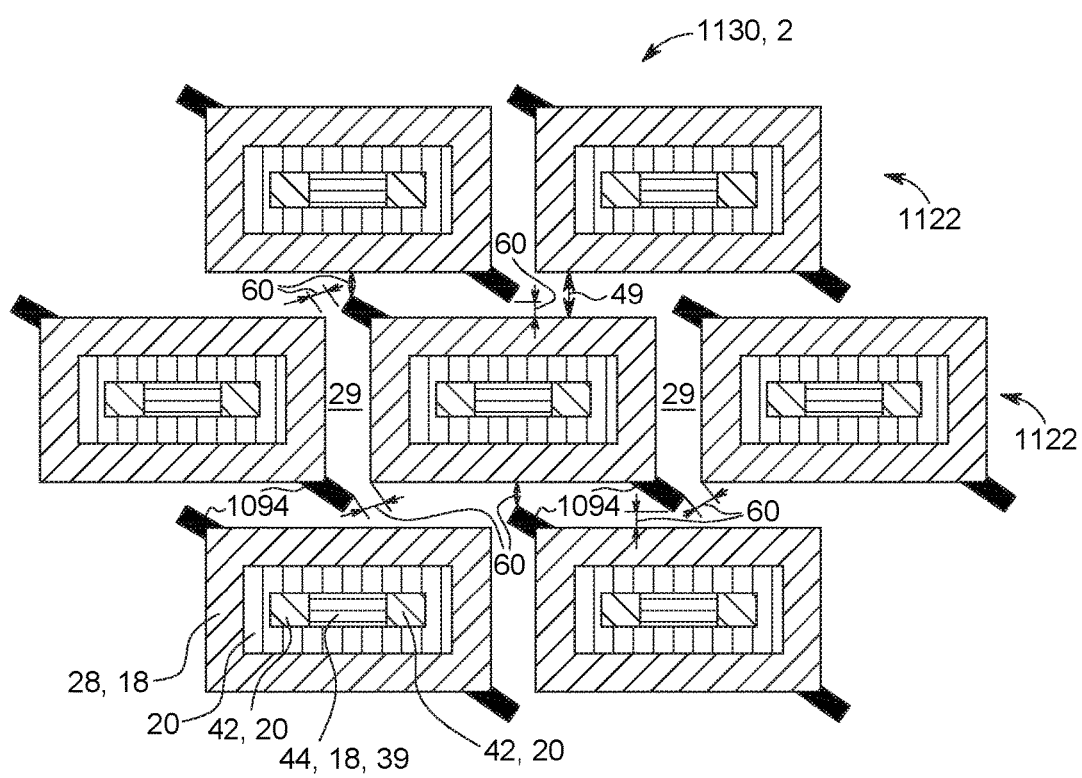

FIG. 12 illustrates a device layout 1130 that includes a number of elongated rectangular SiC device cells 1122, in accordance with embodiments of the present technique. Each of the rectangular device cells 1122 of FIG. 12 includes channel region extensions 1094 that extend from two opposite corners of the channel region 28 and into the JFET region 29. As such, the channel region extensions 1094 generally ensure that all of the distances 60 between the well regions 18 and the channel region extensions 1094 of neighboring device cells 1122 (e.g., between regions of neighboring device cells 1122 that have the second type of conductivity) are less than or equal to the distance 49 between parallel portions of the well regions 18 of the neighboring cells 1122. In other words, the channel region extensions 1094 generally ensure that no portion of the JFET region 29 is wider than $W_{JFET,parallel}$ 49.

Figure 13:
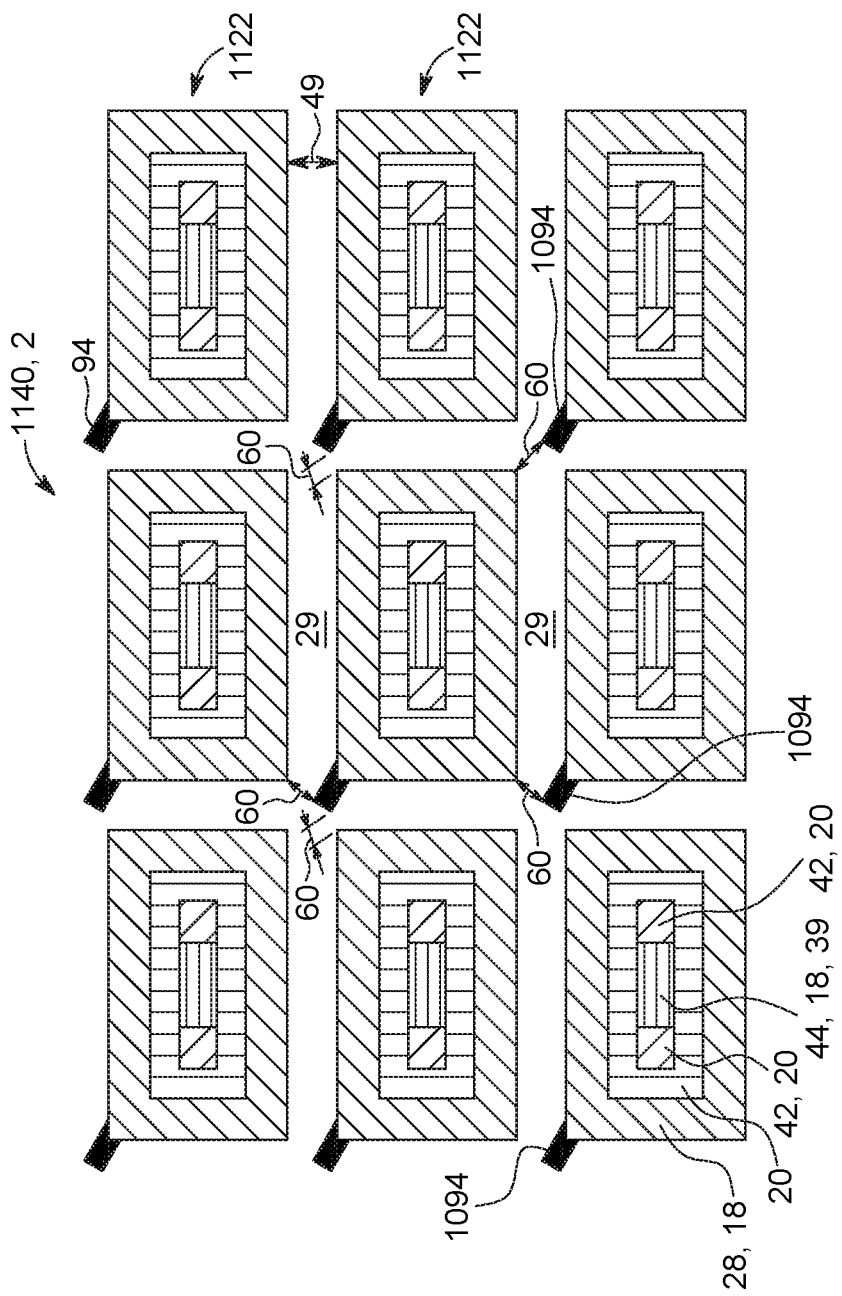

FIG. 13 illustrates a device layout 1140 that includes a number of elongated rectangular device cells 1122, in accordance with embodiments of the present technique. Each of the rectangular device cells 1122 of FIG. 13 includes a channel region extension 1094 that extends from one corner of the channel region 28 and into the JFET region 29. As such, the channel region extensions 1094 generally ensure that all of the distances 60 between the well regions 18 and the channel region extensions 1094 of neighboring device cells 1122 (e.g., between regions of neighboring device cells 1122 that have the second type of conductivity) are less than or equal to the distance 49 between parallel portions of the well regions 18 of the neighboring cells 1122. In other words, the channel region extensions 1094 generally ensure that no portion of the JFET region 29 is wider than $W_{JFET,parallel}$ 49.

Figure 14:
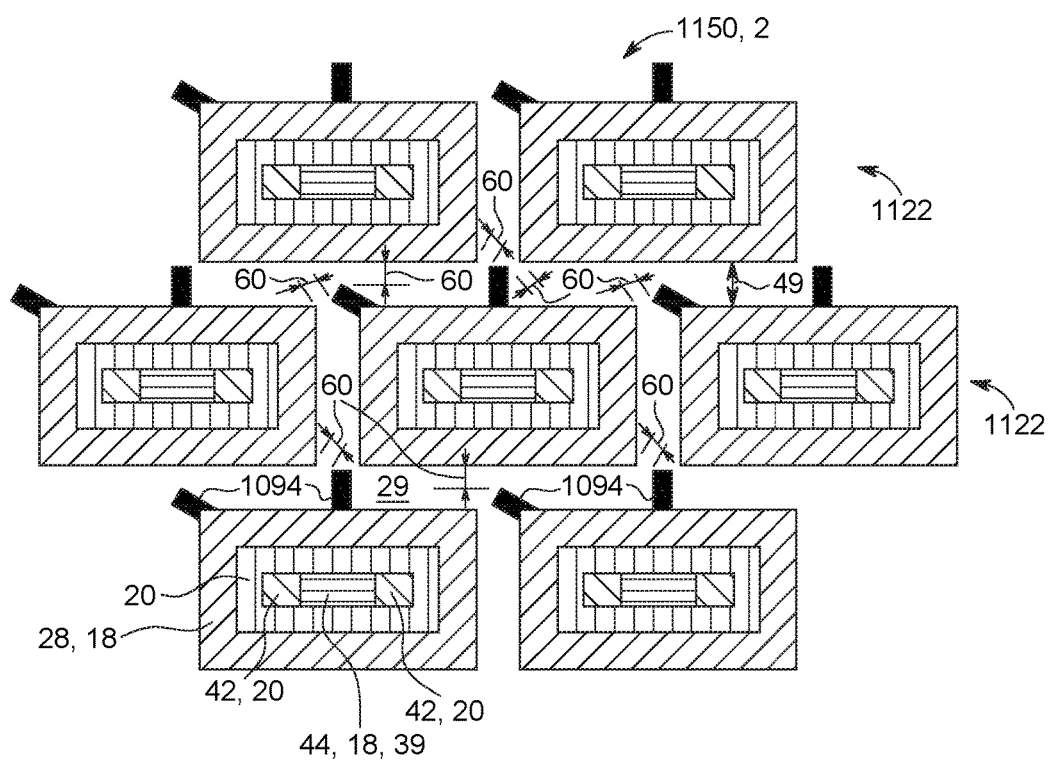

FIG. 14 illustrates a device layout 1150 that includes a number of elongated rectangular device cells 1122, in accordance with embodiments of the present technique. Each of the rectangular device cells 1122 of FIG. 14 includes a channel region extension 1094 that extends the channel region 28 into the JFET region 29. More specifically, the rectangular device cells 1122 of FIG. 14 have a first channel region extension that extends from a corner of the channel region 28, and a second channel region extension that extends through a side of the channel region 28 adjacent to the corner. As such, the channel region extensions 1094 generally ensure that all of the distances 60 between the well regions 18 and the channel region extensions 1094 of neighboring device cells 1122 (e.g., between regions of neighboring device cells 1122 that have the second type of conductivity) are less than or equal to the distance 49 between parallel portions of the well regions 18 of the neighboring cells 1122. In other words, the channel region extensions 1094 generally ensure that no portion of the JFET region 29 is wider than $W_{JFET,parallel}$ 49.

Figure 15:
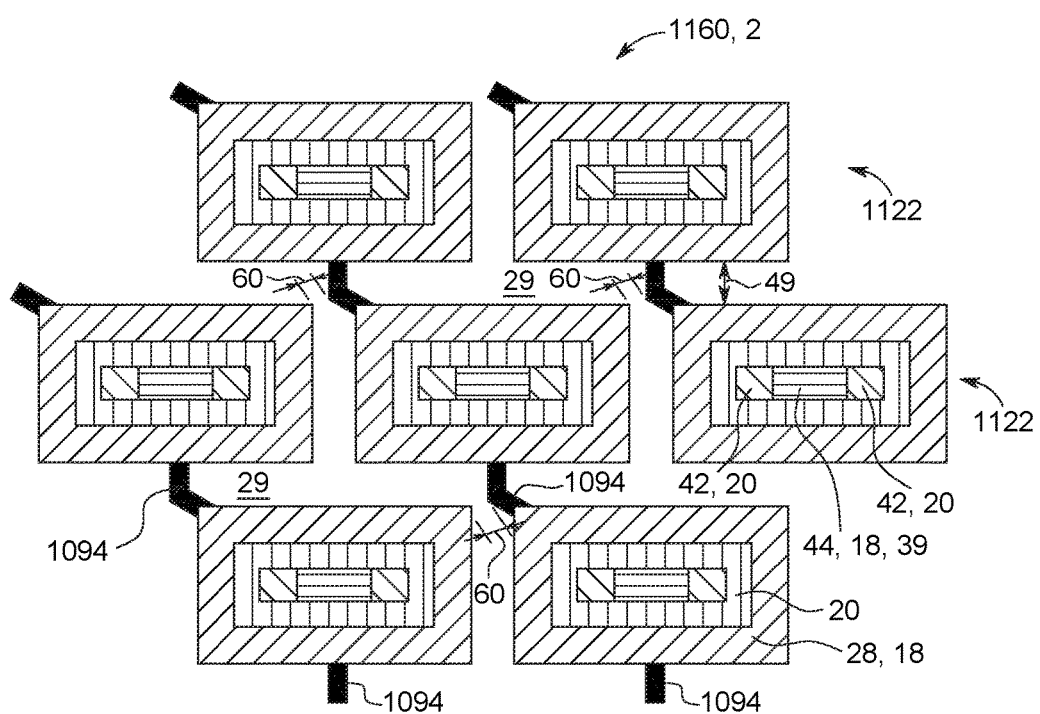

FIG. 15 illustrates a device layout 1160 that includes a number of elongated rectangular device cells 1122, in accordance with embodiments of the present technique. Each of the rectangular device cells 1122 of FIG. 15 includes two channel region extensions 1094 that extend the channel region 28 into the JFET region 29 to overlap with the channel extension 1094 of two different neighboring device cells 1122. More specifically, the device cells 1122 illustrated in FIG. 15 have a first channel extension 1094 that extends from a corner of the channel region 28, and a second channel extension 1094 that extends from a side of the channel region 28 adjacent to the corner. As such, the channel region extensions 1094 generally ensure that all of the distances 60 between the well regions 18 and the channel region extensions 1094 of neighboring device cells 1122 (e.g., between regions of neighboring device cells 1122 that have the second type of conductivity) are less than or equal to the distance 49 between parallel portions of the well regions 18 of the neighboring cells 1122. In other words, the channel region extensions 1094 generally ensure that no portion of the JFET region 29 is wider than $W_{JFET,parallel}$ 49.

Figure 16:
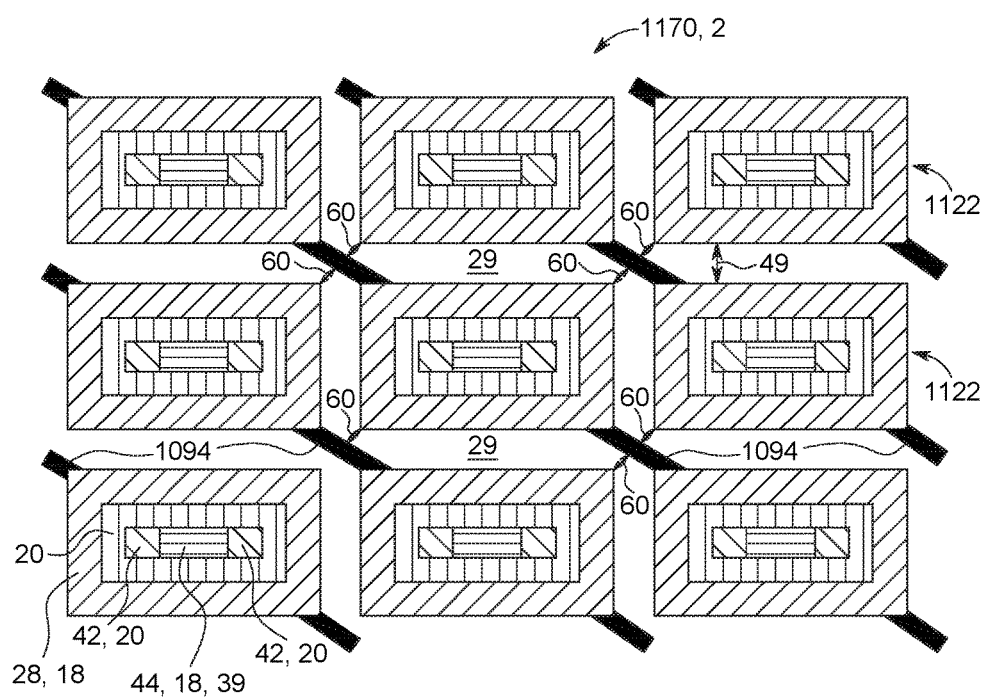

FIG. 16 illustrates a device layout 1170 that includes a number of elongated rectangular device cells 1122, in accordance with embodiments of the present technique. Each of the rectangular device cells 1122 of FIG. 16 includes channel region extensions 1094 that extend from two opposite corners of the channel region 28 and into the JFET region 29 to overlap with the channel region extensions 1094 of two different neighboring device cells 1122. As such, the channel region extensions 1094 generally ensure that all of the distances 60 between the well regions 18 and the channel region extensions 1094 of neighboring device cells 1122 (e.g., between regions of neighboring device cells 1122 that have the second type of conductivity) are less than the distance 49 between parallel portions of the well regions 18 of the neighboring cells 1122. In other words, the channel region extensions 1094 generally ensure that no portion of the JFET region 29 is wider than $W_{JFET,parallel}$ 49.

Figure 17:
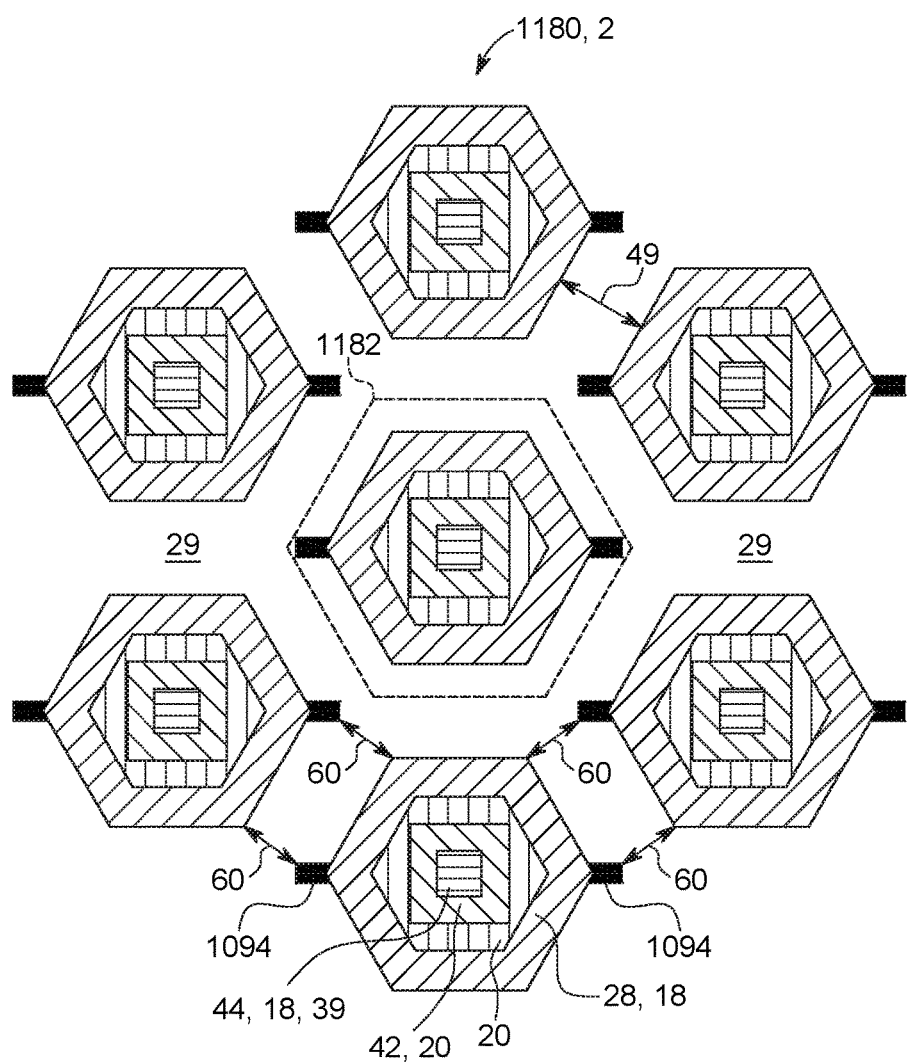
FIGS. 17-22 are top-down views of SiC layers having device layouts that include a number of hexagonal SiC device cells with different examples of channel region extensions, in accordance with embodiments of the present technique.

As mentioned, the presently disclosed channel region extensions may also be used with cellular devices having hexagonal shapes. For example, FIG. 17 illustrates a device layout 1180 that includes a number of hexagonal SiC device cells 1182, in accordance with embodiments of the present technique. Each of the device cells 1182 of FIG. 17 includes channel region extensions 1094 that extend from two opposite corners of the channel region 28 and into the JFET region 29. As such, the channel region extensions 1094 generally ensure that all of the distances 60 between the well regions 18 and the channel region extensions 1094 of neighboring device cells 1182 (e.g., between regions of neighboring device cells 1182 that have the second type of conductivity) are less than or equal to the distance 49 between parallel portions of the well regions 18 of the neighboring cells 1182. In other words, the channel region extensions 1094 generally ensure that no portion of the JFET region 29 is wider than $W_{JFET,parallel}$ 49.

Figure 18:
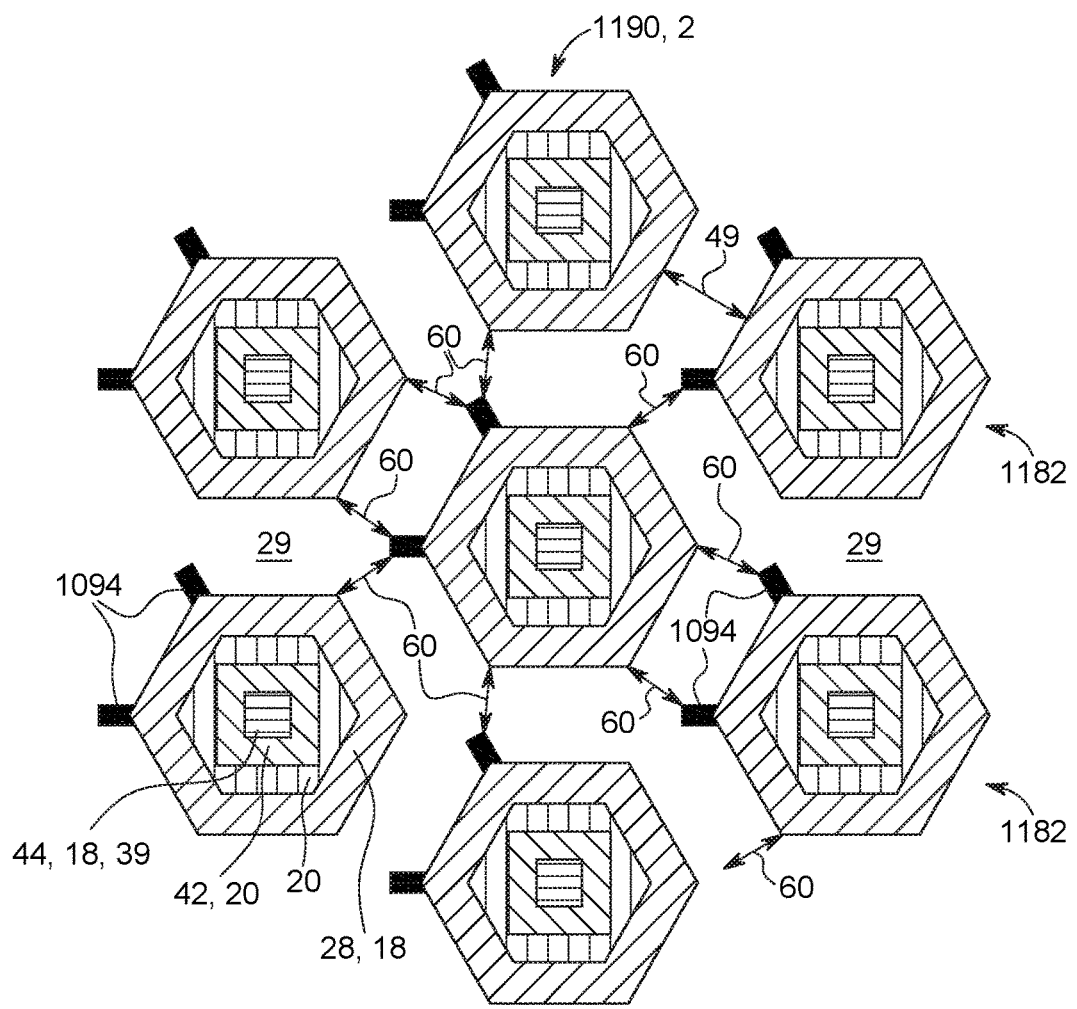

FIG. 18 illustrates a device layout 1190 that includes a number of hexagonal device cells 1182, in accordance with embodiments of the present technique. Each of the device cells 1182 of FIG. 18 includes channel region extensions 1094 that extend from two adjacent corners of the channel region 28 and into the JFET region 29. As such, the channel region extensions 1094 generally ensure that all of the distances 60 between the well regions 18 and the channel region extensions 1094 of neighboring device cells 1182 (e.g., between regions of neighboring device cells 1182 that have the second type of conductivity) are less than or equal to the distance 49 between parallel portions of the well regions 18 of the neighboring cells 1182. In other words, the channel region extensions 1094 generally ensure that no portion of the JFET region 29 is wider than $W_{JFET,parallel}$ 49.

Figure 19:
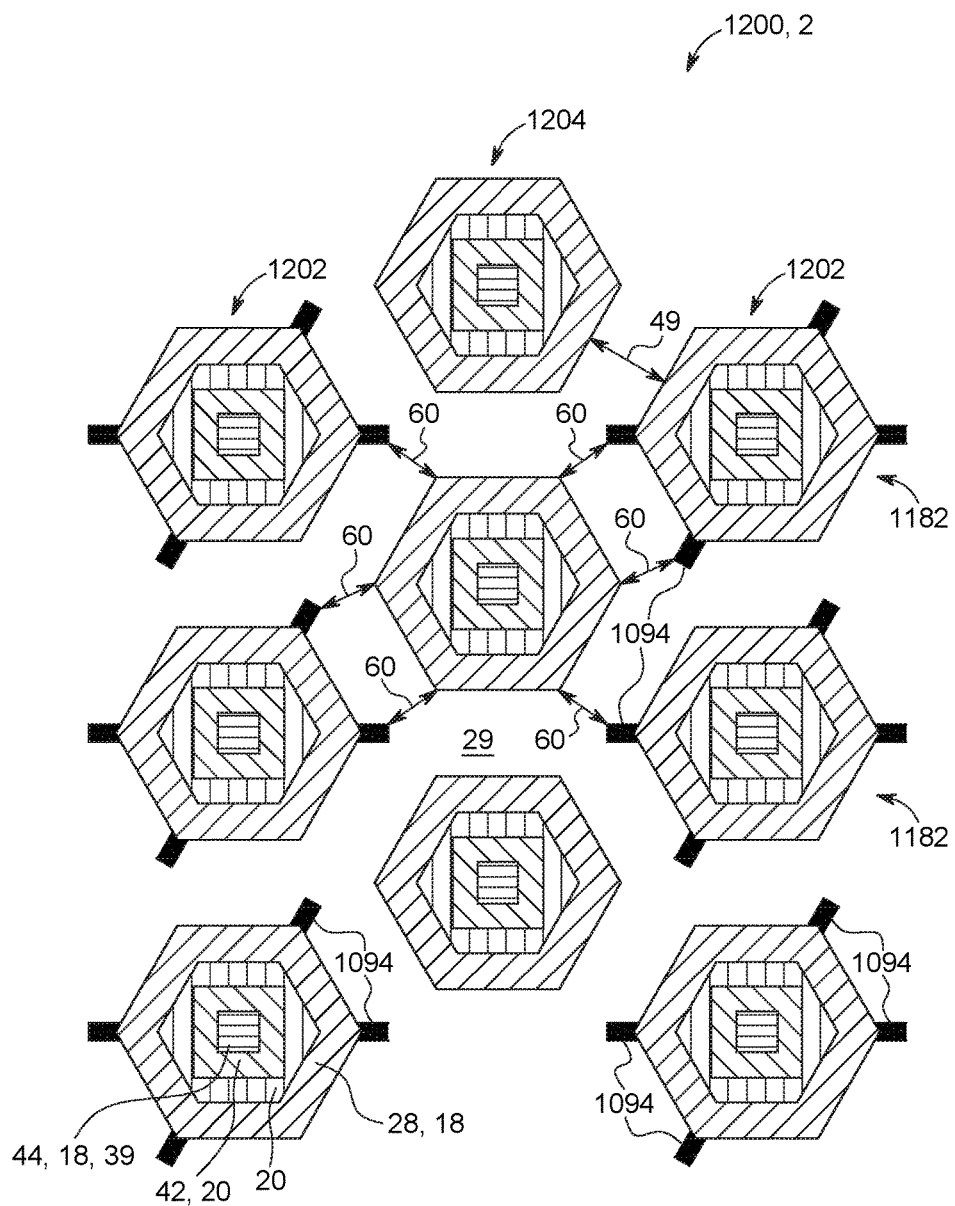

FIG. 19 illustrates a device layout 1200 that includes a number of hexagonal device cells 1182, in accordance with embodiments of the present technique. A portion of the device cells 1182 of FIG. 19 include channel region extensions 1094 that extend the channel region 28 into the JFET region 29. More specifically, the illustrated layout 1200 of FIG. 19 includes a first column 1202 of device cells 1182 that each include channel region extensions 1094 extending from two pairs of opposite corners (two pairs of adjacent corners) of the well regions 28 of the device cells 1182, which is followed by a second column 1204 of device cells 1182 that do not include a channel extension 1094 and are shielded by the channel region extensions 1094 of neighboring cells 1182. As such, the channel region extensions 1094 generally ensure that all of the distances 60 between the well regions 18 and the channel region extensions 1094 of neighboring device cells 1182 (e.g., between regions of neighboring device cells 1182 that have the second type of conductivity) are less than or equal to the distance 49 between parallel portions of the well regions 18 of the neighboring cells 1182. In other words, the channel region extensions 1094 generally ensure that no portion of the JFET region 29 is wider than $W_{JFET,parallel}$ 49.

Figure 20:
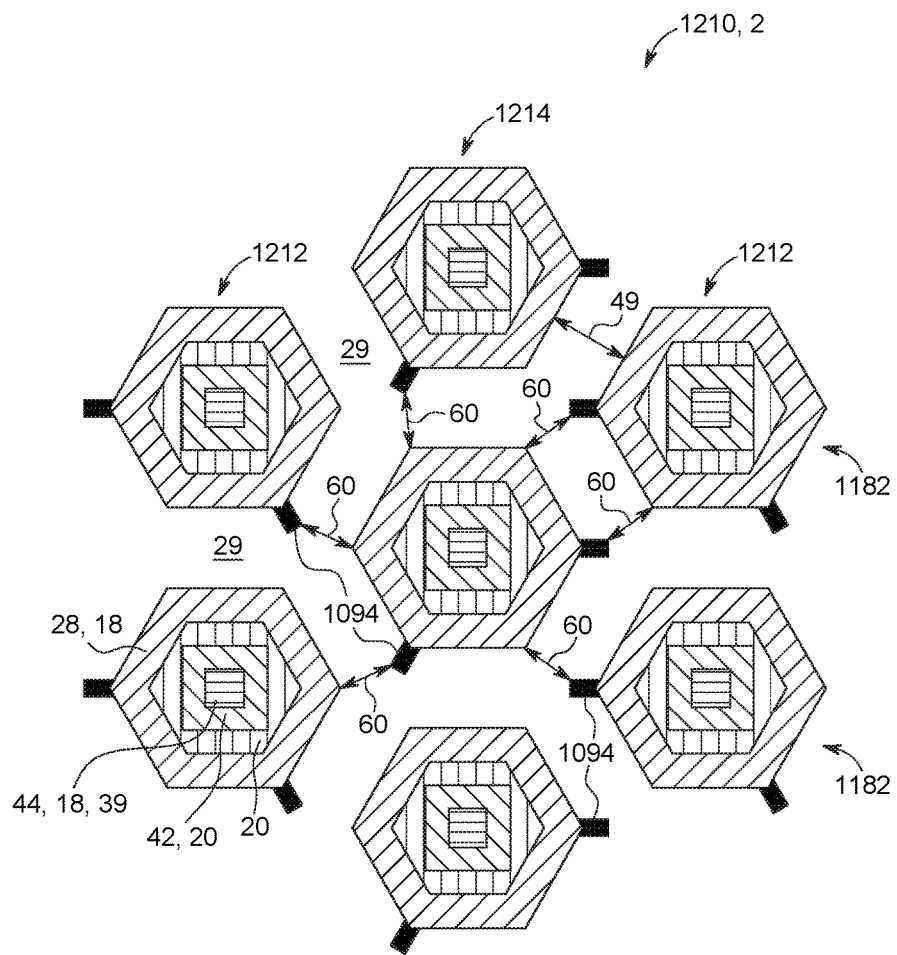

FIG. 20 illustrates a device layout 1210 that includes a number of hexagonal device cells 1182, in accordance with embodiments of the present technique. Each of the device cells 1182 of FIG. 20 includes channel region extensions 1094 that extend from two corners of the channel region 28 and into the JFET region 29. More specifically, the illustrated layout 1210 of FIG. 20 includes a first column 1212 of device cells 1182 that each include channel region extensions 1094 extending from two (e.g., non-adjacent, non-opposite) corners of the channel regions 28 of the cells 1182, followed by a second column 1214 of device cells 1182 that each include channel region extensions 1094 extending from two (e.g., non-adjacent, non-opposite) corners of the channel regions 28 of the cells 1182, wherein the two corners are equivalent for columns 1212 and 1214. As such, the channel region extensions 1094 generally ensure that all of the distances 60 between the well regions 18 and the channel region extensions 1094 of neighboring device cells 1182 (e.g., between regions of neighboring device cells 1182 that have the second type of conductivity) are less than or equal to the distance 49 between parallel portions of the well regions 18 of the neighboring cells 1182. In other words, the channel region extensions 1094 generally ensure that no portion of the JFET region 29 is wider than $W_{JFET,parallel}$ 49.

Figure 21:
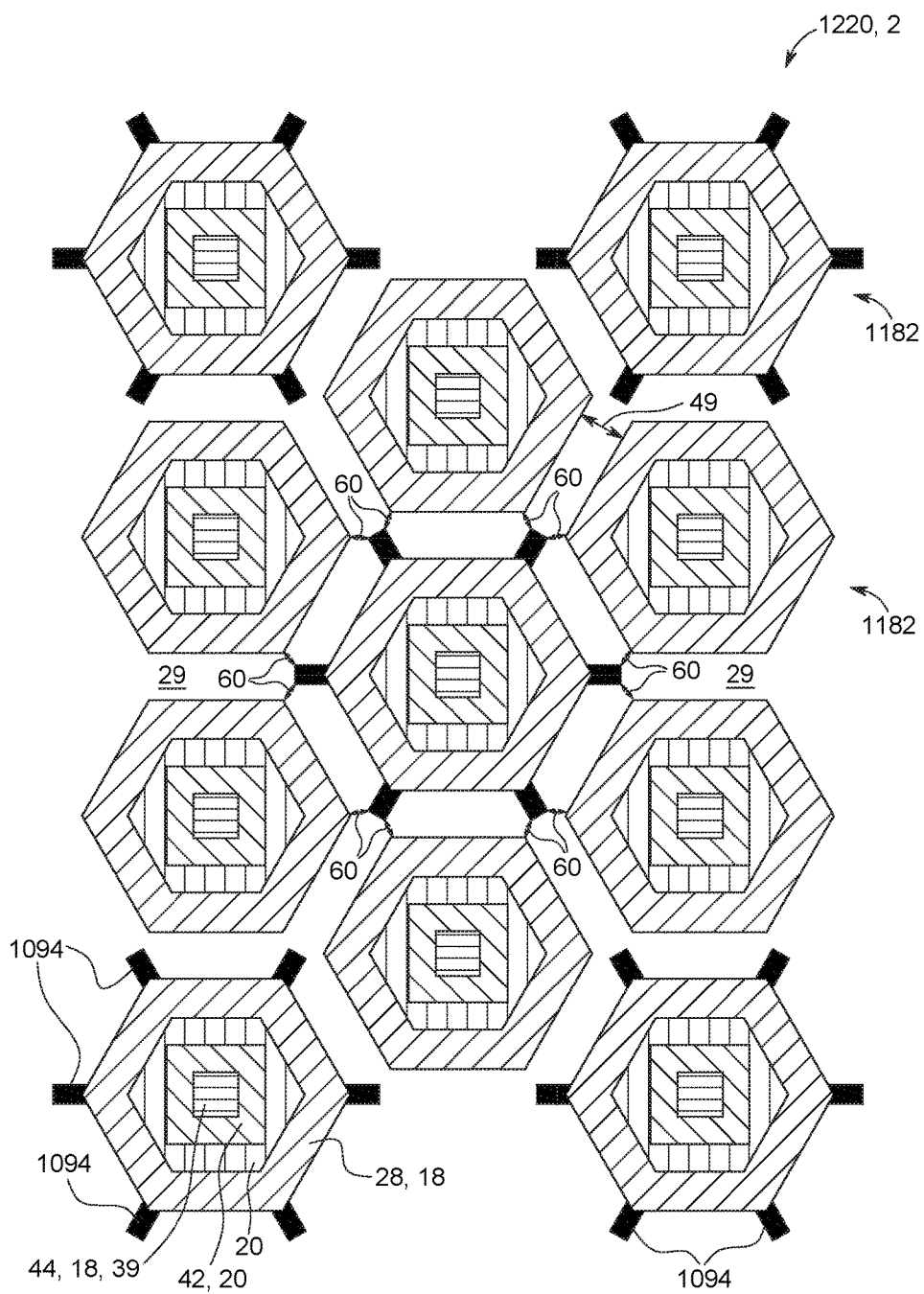

FIG. 21 illustrates a device layout 1220 that includes a number of hexagonal device cells 1182, in accordance with embodiments of the present technique. A portion of the device cells 1182 of FIG. 21 include channel region extensions 1094 that extend the channel region 28 into the JFET region 29. More specifically, a portion of the device cells 1182 illustrated in FIG. 21 include channel region extensions 1094 that extend from all corners of the channel region 28. Additionally, the remainder of the device cells 1182 do not include a channel extension 1094 extending from their channel regions 28, and the portions of the JFET region 29 where the device cells 1182 meet is shielded by the channel region extensions 1094 of the neighboring device cells 1182. As such, the channel region extensions 1094 generally ensure that all of the distances 60 between the well regions 18 and the channel region extensions 1094 of neighboring device cells 1182 (e.g., between regions of neighboring device cells 1182 that have the second type of conductivity) are less than or equal to the distance 49 between parallel portions of the well regions 18 of the neighboring cells 1182. In other words, the channel region extensions 1094 generally ensure that no portion of the JFET region 29 is wider than $W_{JFET,parallel}$ 49. Further, for the device layout 1220 of FIG. 21, the device cells 1182 that include channel region extensions 1094 are separated (e.g., isolated, surrounded on six sides, surrounded on all sides) by device cells 1182 that do not include channel region extensions 1094.

Figure 22:
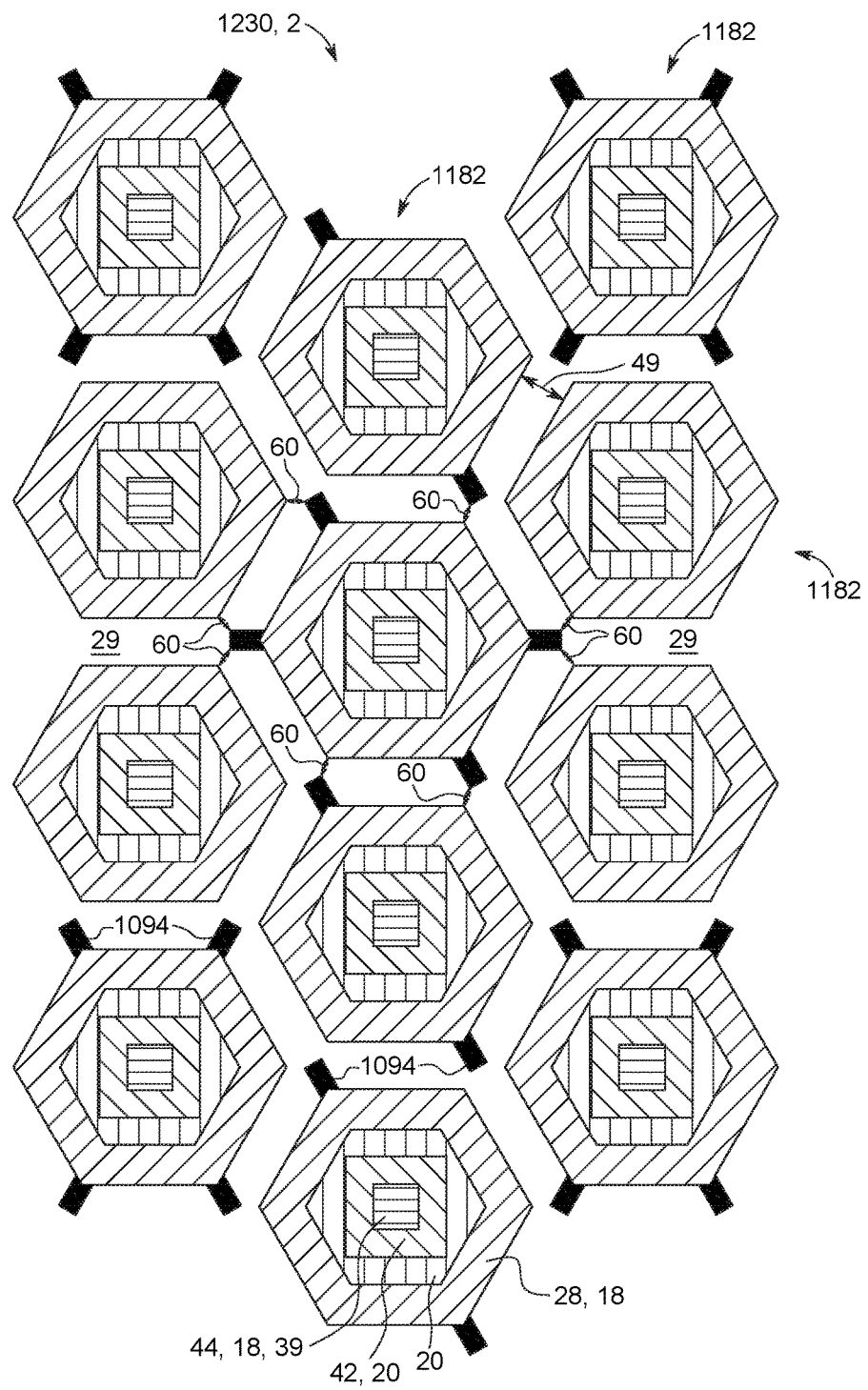

FIG. 22 illustrates a device layout 1230 that includes a number of hexagonal device cells 1182, in accordance with embodiments of the present technique. A portion of the device cells 1182 of FIG. 22 include channel region extensions 1094 that extend the channel region 28 into the JFET region 29. More specifically, a portion of the device cells 1182 illustrated in FIG. 22 include channel region extensions 1094 that extend from two, opposite corners of the channel region 28 of the cells 1182. Another portion of the device cells 1182 include channel region extensions 1094 that extend from two pairs of opposite corners (or two pairs of adjacent corners) of the channel region 28 of the cells 1182. Yet another portion of the device cells 1182 do not include a channel extension 1094, and the portions of the JFET region where the device cells 1182 meet are shielded by the channel region extensions 1094 of neighboring device cells 1182. As such, the channel region extensions 1094 generally ensure that all of the distances 60 between the well regions 18 and the channel region extensions 1094 of neighboring device cells 1182 (e.g., between regions of neighboring device cells 1182 that have the second type of conductivity) are less than or equal to the distance 49 between parallel portions of the well regions 18 of the neighboring cells 1182. In other words, the channel region extensions 1094 generally ensure that no portion of the JFET region 29 is wider than $W_{JFET,parallel}$ 49.

FIG. 23 illustrates a device layout 1240 that includes a number of elongated hexagonal device cells 1242, in accordance with embodiments of the present technique. Each of the device cells 1242 of FIG. 23 includes channel region extensions 1094 that extend from two adjacent corners of the channel region 28 and into the JFET region 29. As such, the channel region extensions 1094 generally ensure that all of the distances 60 between the well regions 18 and the channel region extensions 1094 of neighboring device cells 1242 (e.g., between regions of neighboring device cells 1242 that have the second type of conductivity) are less than or equal to the distance 49 between parallel portions of the well regions 18 of the neighboring cells 1242. In other words, the channel region extensions 1094 generally ensure that no portion of the JFET region 29 is wider than $W_{JFET,parallel}$ 49.

FIG. 24 illustrates a device layout 1250 that includes a number of elongated hexagonal device cells 1242, in accordance with embodiments of the present technique. Each of the device cells 1242 of FIG. 24 includes channel region extensions 1094 that extend from two opposite corners of the channel region 28 and into the JFET region 29. As such, the channel region extensions 1094 generally ensure that all of the distances 60 between the well regions 18 and the channel region extensions 1094 of neighboring device cells 1242 (e.g., between regions of neighboring device cells 1242 that have the second type of conductivity) are less than or equal to the distance 49 between parallel portions of the well regions 18 of the neighboring cells 1242. In other words, the channel region extensions 1094 generally ensure that no portion of the JFET region 29 is wider than $W_{JFET,parallel}$ 49.

Figure 25:
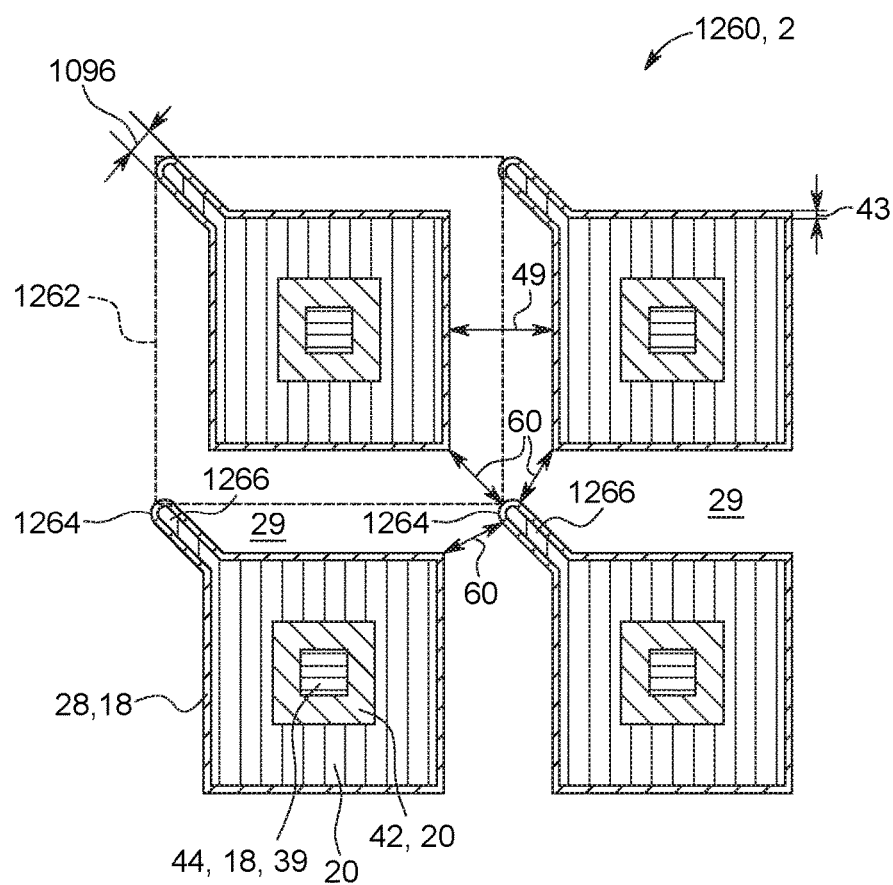
FIGS. 25-27 are a top-down views of SiC layers having device layouts that include a number of square SiC device cells with different examples of channel region extensions and source region extensions, in accordance with embodiments of the present technique.
Figure 26:
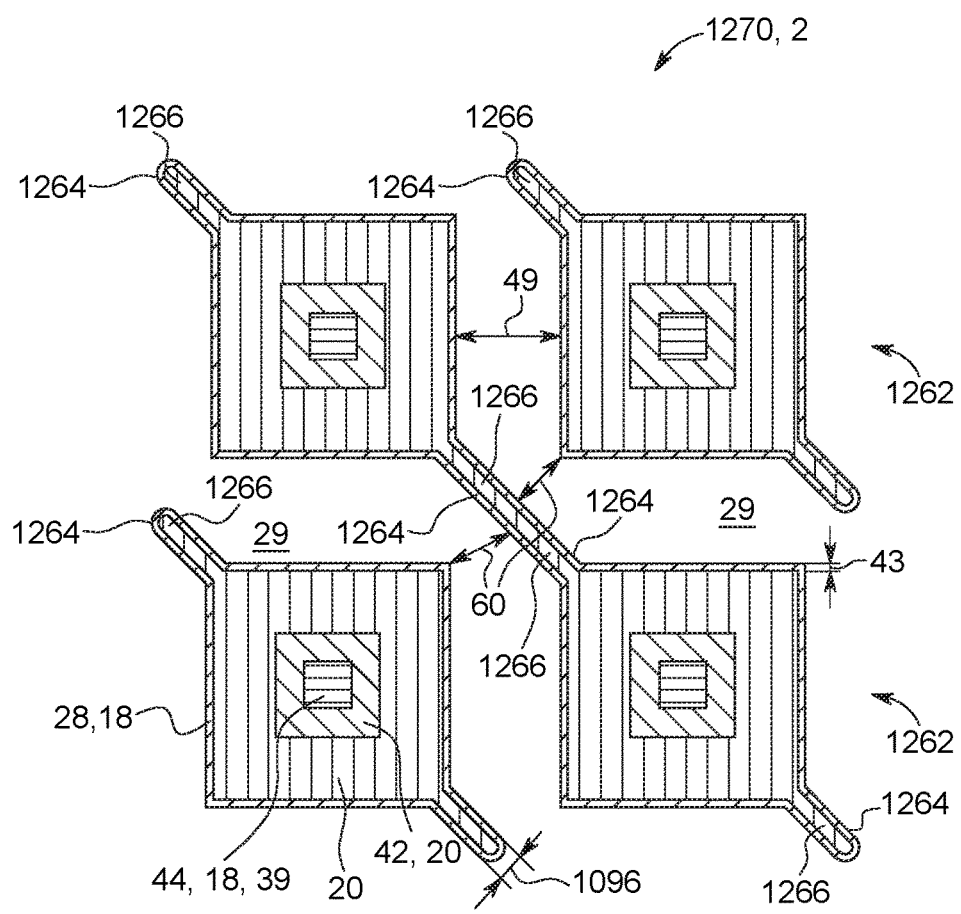
Figure 27:
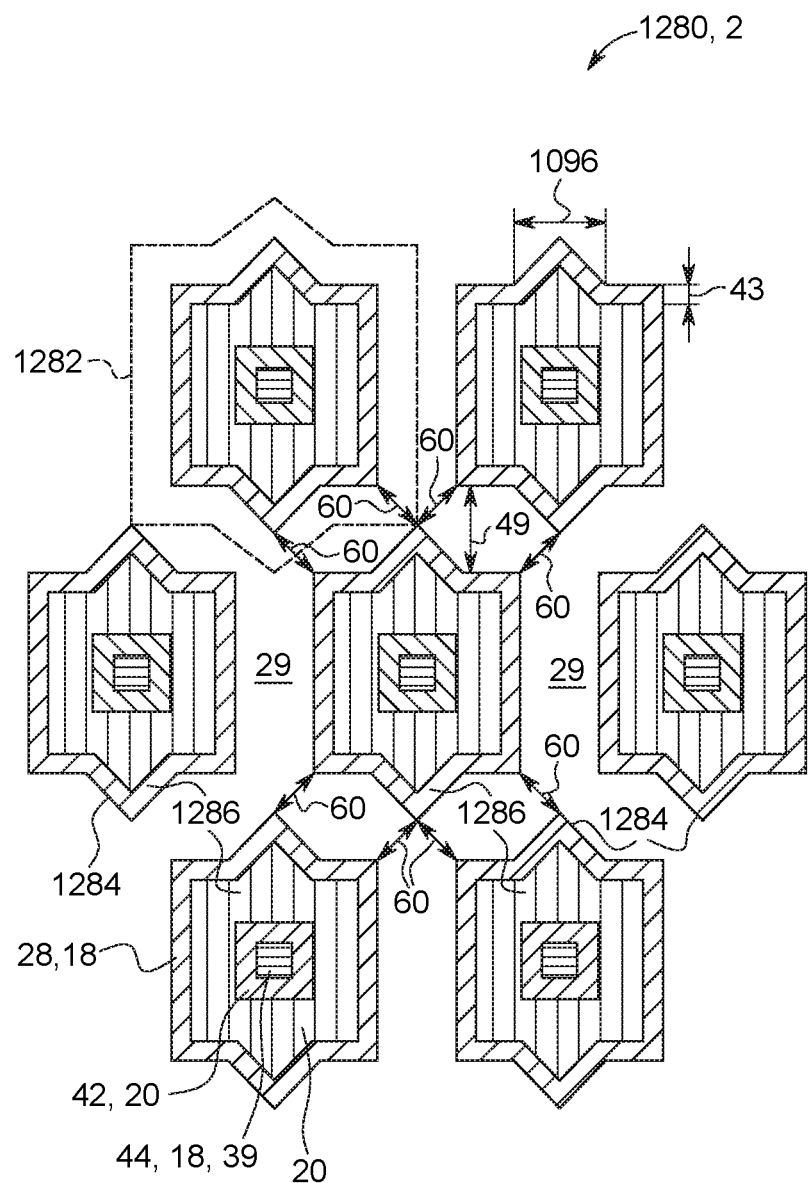

As mentioned, in certain embodiments the width of the channel region extension of a device cell may be greater than twice the channel length 43 (i.e., $>2L_{ch}$) of the device cell. For such embodiments, the device cell may also include a source region extension that extends in the same direction as the channel extension, such that the channel region extension can form a conductive channel during device operation. FIGS. 25-27 are top-down views of device layouts that include a number of example device cells having both channel region extensions and source region extensions, in accordance with embodiments of the present technique. It may be appreciated that these source region extensions may be implanted during the same implantation step used to form the source region 20 of the device cells. It may also be appreciated that, while the example device cells of FIGS. 25-27 are square device cells (or modified square device cells), in other embodiments, channel and source region extensions can be used with device cells having other shapes (e.g., rectangular, hexagonal, elongated hexagonal, irregular, etc.), in accordance with the present disclosure.

FIG. 25 illustrates a device layout 1260 that includes a number of device cells 1262, in accordance with embodiments of the present technique. Each of the device cells 1262 of FIG. 25 includes a channel region extension 1264 that extends from one corner of the channel region 28 and into the JFET region 29. The width 1096 of the channel region extensions 1264 are greater than twice the channel length 43 for the device cells 1262. As such, the device cells 1262 each include a source region extension 1266 that extends in the same direction as the channel region extension 1264. As such, the channel region extensions 1264 generally ensure that all of the distances 60 between the well regions 18 and the channel region extensions 1264 of neighboring device cells 1262 (e.g., between regions of neighboring device cells 1262 that have the second type of conductivity) are less than or equal to the distance 49 between parallel portions of the well regions 18 of the neighboring cells 1262. In other words, the channel region extensions 1094 generally ensure that no portion of the JFET region 29 is wider than $W_{JFET,parallel}$ 49.

In certain embodiments, like the channel region extensions, the disclosed source region extensions can also couple to the source region extensions of neighboring device cells. FIG. 26 illustrates a device layout 1270 that includes a number of device cells 1262, in accordance with embodiments of the present technique. Each of the device cells 1262 of FIG. 26 includes channel region extensions 1264 that extend the channel region 28 into the JFET region 29 to overlap with the channel region extensions 1264 of two different neighboring cells 1262. Further, for the device cells 1262 illustrated in FIG. 26, the width 1096 of the channel region extensions 1264 is greater than twice the channel length 43. The device cells 1262 each include source region extensions 1266 that extend in the same direction as the channel region extension 1264 and overlap with the source region extensions 1266 of two neighboring cells 1262. As such, the channel region extensions 1264 generally ensure that all of the distances 60 between the well regions 18 and the channel region extensions 1264 of neighboring device cells 1262 (e.g., between regions of neighboring device cells 1262 that have the second type of conductivity) are less than or equal to the distance 49 between parallel portions of the well regions 18 of the neighboring cells 1262. In other words, the channel region extensions 1094 generally ensure that no portion of the JFET region 29 is wider than $W_{JFET,parallel}$ 49.

FIG. 27 illustrates a device layout 1280 that includes a number of device cells 1282, in accordance with embodiments of the present technique. Each of the device cells 1282 of FIG. 27 includes channel region extensions 1284 that extend from two opposite sides of the channel region 28 and into the JFET region 29. Further, the maximum width 1096 of at least one of the channel region extensions 1284 is greater than twice the channel length 43 for the device cells 1282, and, as such, the device cells 1282 each include source region extensions 1286 that extend in the same direction as the channel extension 1284. As such, the channel region extensions 1284 generally ensure that all of the distances 60 between the well regions 18 and the channel region extensions 1284 of neighboring device cells 1282 (e.g., between regions of neighboring device cells 1282 that have the second type of conductivity) are less than or equal to the distance 49 between parallel portions of the well regions 18 of the neighboring cells 1282. In other words, the channel region extensions 1284 generally ensure that no portion of the JFET region 29 is wider than $W_{JFET,parallel}$ 49.

Technical effects of the present disclosure include cellular device designs that incorporate one or more shielding regions, in the form of channel region extensions, that reduce the electric field in the portion of the JFET region where multiple device cells meet without significantly increasing $R_{ds}$(on). The disclosed channel region extensions are designed to make the distance between a cell well region corner and a neighboring device cell well region less than or equal to the distance between parallel portions of the well regions of the cells, while maintaining a channel region width and/or a JFET region density that is greater than or equal to that of a conventional stripe device cell of comparable dimensions. Accordingly, the presently disclosed shielded cellular device cells provide superior performance relative to a conventional stripe device cells of comparable dimensions, while still providing similar reliability (e.g., long-term, high-temperature stability, reduced DIBL). Furthermore, the channel region extensions of the presently disclosed cellular designs may be implanted along with the well region of the device cells, and as such, do not increase the complexity or cost of fabrication.

The invention claimed is:

1. A device, comprising:
   a plurality of device cells at least partially disposed in a semiconductor device layer having a first conductivity type, wherein each device cell of the plurality comprises:
   a body region having a second conductivity type disposed near the center of the device cell;
   a source region having the first conductivity type disposed adjacent to the body region of the device cell;
   a channel region having the second conductivity type disposed adjacent to the source region of the device cell; and
   a JFET region having the first conductivity type disposed adjacent the channel region of the device cell, wherein the JFET region has a parallel JFET width between the channel region, of the device cell and a parallel portion of a channel region of a neighboring device cell of the plurality of device cells,
   wherein at least one device cell of the plurality of device cells comprises a channel region extension having the second conductivity type that, extends outwardly from the channel region of the at least one device cell and into the JFET region, such that a distance between the channel region extension of the at least one device cell and a region of the neighboring device cell having the second conductivity type is less than or equal to the parallel JFET width and the channel region extension of the at least one device cell has a width that is greater than twice a length ($L_{ch}$) of the channel region of the at least one device cell, and wherein the at least one device cell comprises a source region extension that extends from the source region of the device cell in the same direction as the channel region extension of the at least one device cell.

2. The device of claim 1, wherein the semiconductor device layer is a silicon carbide (SiC) semiconductor device layer.

3. The device of claim 1, wherein the distance between the channel region extension of the at least one device cell and the region of the neighboring device cell having the second conductivity type is less than the parallel JEET width.

4. The device of claim 1, wherein the channel region extension of the at least one device cell has a width between approximately 0.1 μm and approximately 2 μm.

5. The device of claim 4, wherein the width of the channel region extension of the at least one device cell is between approximately 0.1 μm and approximately 1 μm.

6. The device of claim 1, wherein at least two device cells of the plurality of device cells include a respective channel region extension, and wherein the channel region extensions of the at least two device cells extend towards and overlap with one another.

7. The device of claim 1, wherein at least two device cells of the plurality of device cells include a respective channel region extension and a respective source region extension, and wherein the channel region extensions of the at least two device cells extend towards and overlap with one another.

8. The device of claim 7, wherein the source region extensions of the at least two device cells also extend towards and overlap with one another.

9. The device of claim 1, wherein the channel region extension of the at least one device cell does not extend through all corners of the channel region of the at least one device cell.

10. The device of claim 1, wherein the channel region extension has a variable width.

11. The device of claim 1, wherein one or more device cells of the plurality of device cells disposed adjacent to the at least one device cell do not include respective channel region extensions, and wherein a widest portion of JFET region of one or more device cells is shielded by the channel region extension of the at least one adjacent device cell.

12. The device of claim 1, wherein the channel region extension of the at least one device cell extends from at least one corner and at least one side of the channel region of the device cell.

13. The device of claim 1, wherein each of the plurality of device cells has a substantially square, hexagonal, elongated rectangular shape, or elongated hexagonal shape.

14. The device of claim 1, wherein the device is a field effect transistor (FET), an insulated gate bipolar transistor (IGBT), or an insulated base MOS-controlled thyristor (IB-MCT).

15. The device of claim 1, wherein the channel region extension has a variable width and the channel region extension of the at least one device cell extends from at least one corner and at least one side of the channel region of the device cell.

16. The device of claim 13, wherein one or more device cells of the plurality of device cells disposed adjacent to the at least one device cell do not include respective channel region extensions, and wherein a widest portion of JFET region of one or more device cells is shielded by the channel region extension of the at least one adjacent device cell.

17. The device of claim 15, wherein each of the plurality of device cells has a substantially square, hexagonal, elongated rectangular shape, or elongated hexagonal shape.

18. The device of claim 15, wherein the channel region extension of the at least one device cell has a width between approximately 0.1 μm and approximately 2 μm.

19. The device of claim 18, wherein the width of the channel region extension of the at least one device cell is between approximately 0.1 μm and approximately 1 μm.

* * * * *